(12) United States Patent
Stuber et al.

(10) Patent No.: US 9,412,644 B2
(45) Date of Patent: Aug. 9, 2016

(54) INTEGRATED CIRCUIT ASSEMBLY AND METHOD OF MAKING

(71) Applicant: QUALCOMM SWITCH CORP., San Diego, CA (US)

(72) Inventors: Michael A. Stuber, Rancho Santa Fe, CA (US); Stuart B. Molin, Carlsbad, CA (US); Mark Drucker, Poway, CA (US); Peter Fowler, Poway, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/572,580

(22) Filed: Dec. 16, 2014

(65) Prior Publication Data

US 2015/0140782 A1    May 21, 2015

Related U.S. Application Data

(63) Continuation of application No. 13/725,306, filed on Dec. 21, 2012, now Pat. No. 8,912,646, which is a continuation-in-part of application No. 13/459,110, filed on Apr. 28, 2012, now Pat. No. 8,357,975, which (Continued)

(51) Int. Cl.
| | |
|---|---|
| *H01L 21/30* | (2006.01) |
| *H01L 21/762* | (2006.01) |
| *H01L 21/84* | (2006.01) |

(52) U.S. Cl.
CPC .......... *H01L 21/76251* (2013.01); *H01L 21/84* (2013.01)

(58) Field of Classification Search
CPC ............ H01L 51/5012; H01L 51/5088; H01L 51/0072; H01L 51/5056; H01L 51/5072

USPC ............ 438/455, 458; 257/E21.505, E21.511
See application file for complete search history.

(56) References Cited

U.S. PATENT DOCUMENTS

| 4,053,916 A | 10/1977 | Cricchi et al. |
|---|---|---|
| 4,939,568 A | 7/1990 | Kato et al. |

(Continued)

FOREIGN PATENT DOCUMENTS

| CN | 1784785 A | 6/2006 |
|---|---|---|
| CN | 101140915 A | 3/2008 |

(Continued)

OTHER PUBLICATIONS

European Examination Report dated Mar. 19, 2013 for European Application No. 10 734 619.9.

(Continued)

*Primary Examiner* — Andy Huynh
(74) *Attorney, Agent, or Firm* — Haynes and Boone, LLC

(57) ABSTRACT

A first wafer is provided that includes an insulating layer, a first active layer, and a handle layer. The insulating layer has a first surface and a second surface. The first active layer contacts the first surface of the insulating layer. The handle layer contacts the second surface of the insulating layer. A second wafer is provided that includes a substrate and a second active layer. The substrate has a first surface and a second surface. The second active layer contacts the first surface of the substrate. The second wafer is bonded to the first wafer by physically connecting the first active layer to the second surface of the substrate. The handle layer is removed. A metal bond pad is formed on the second surface of the insulating layer. The metal bond pad is electrically connected to the first active layer.

14 Claims, 18 Drawing Sheets

Related U.S. Application Data is a continuation of application No. 12/836,506, filed on Jul. 14, 2010, now Pat. No. 8,232,597.

(60) Provisional application No. 61/225,914, filed on Jul. 15, 2009.

(56) References Cited

U.S. PATENT DOCUMENTS

| | | | |
|---|---|---|---|
| 5,229,647 A | 7/1993 | Gnadinger | |
| 5,376,579 A | 12/1994 | Annamalai | |
| 5,434,750 A | 7/1995 | Rostoker et al. | |
| 5,489,792 A | 2/1996 | Hu et al. | |
| 5,580,802 A | 12/1996 | Mayer et al. | |
| 5,777,365 A | 7/1998 | Yamaguchi et al. | |
| 5,793,107 A | 8/1998 | Nowak | |
| 5,880,010 A | 3/1999 | Davidson | |
| 5,955,781 A | 9/1999 | Joshi et al. | |
| 5,999,414 A | 12/1999 | Baker et al. | |
| 6,027,958 A | 2/2000 | Vu et al. | |
| 6,080,608 A | 6/2000 | Nowak | |
| 6,110,769 A | 8/2000 | Son | |
| 6,121,659 A | 9/2000 | Christensen et al. | |
| 6,153,912 A | 11/2000 | Holst | |
| 6,180,487 B1 | 1/2001 | Lin | |
| 6,180,985 B1 | 1/2001 | Yeo | |
| 6,190,985 B1 | 2/2001 | Buynoski | |
| 6,191,476 B1 | 2/2001 | Takahashi et al. | |
| 6,229,187 B1 | 5/2001 | Ju | |
| 6,320,228 B1 | 11/2001 | Yu | |
| 6,352,882 B1 | 3/2002 | Assaderaghi et al. | |
| 6,437,405 B2 | 8/2002 | Kim | |
| 6,483,147 B1 | 11/2002 | Lin | |
| 6,498,370 B1 | 12/2002 | Kim et al. | |
| 6,531,753 B1 | 3/2003 | Lin | |
| 6,566,240 B2 | 5/2003 | Udrea et al. | |
| 6,573,565 B2 | 6/2003 | Clevenger et al. | |
| 6,740,548 B2 | 5/2004 | Darmawan | |
| 6,759,714 B2 | 7/2004 | Kim et al. | |
| 6,833,587 B1 | 12/2004 | Lin | |
| 6,847,098 B1 | 1/2005 | Tseng et al. | |
| 6,889,429 B2 | 5/2005 | Celaya et al. | |
| 6,900,501 B2 | 5/2005 | Darmawan | |
| 7,052,937 B2 | 5/2006 | Clevenger et al. | |
| 7,109,532 B1 | 9/2006 | Lee et al. | |
| 7,135,766 B1 | 11/2006 | Costa et al. | |
| 7,211,458 B2 | 5/2007 | Ozturk et al. | |
| 7,227,205 B2 | 6/2007 | Bryant et al. | |
| 7,238,591 B1 | 7/2007 | Lin | |
| 7,244,663 B2 | 7/2007 | Kirby | |
| 7,402,897 B2 | 7/2008 | Leedy | |
| 7,485,571 B2 | 2/2009 | Leedy | |
| 7,541,644 B2 | 6/2009 | Hirano et al. | |
| 7,713,842 B2 | 5/2010 | Nishihata et al. | |
| 7,759,220 B2 | 7/2010 | Henley | |
| 7,782,629 B2 | 8/2010 | Graydon et al. | |
| 7,888,606 B2 | 2/2011 | Sakamoto et al. | |
| 7,906,817 B1 | 3/2011 | Wu et al. | |
| 8,013,342 B2 | 9/2011 | Bernstein et al. | |
| 8,232,597 B2 | 7/2012 | Stuber et al. | |
| 8,357,975 B2 | 1/2013 | Stuber et al. | |
| 8,859,347 B2 | 10/2014 | Stuber et al. | |
| 8,912,646 B2 | 12/2014 | Stuber et al. | |
| 9,029,201 B2 | 5/2015 | Nygaard et al. | |
| 9,034,732 B2 | 5/2015 | Molin et al. | |
| 2002/0027271 A1 | 3/2002 | Vaiyapuri | |
| 2002/0041003 A1 | 4/2002 | Udrea et al. | |
| 2002/0079507 A1 | 6/2002 | Shim et al. | |
| 2002/0086465 A1 | 7/2002 | Houston | |
| 2002/0089016 A1 | 7/2002 | Joly et al. | |
| 2002/0163041 A1 | 11/2002 | Kim | |
| 2002/0175406 A1 | 11/2002 | Callahan | |
| 2003/0107084 A1 | 6/2003 | Darmawan | |
| 2004/0051120 A1 | 3/2004 | Kato | |
| 2004/0150013 A1 | 8/2004 | Ipposhi | |
| 2004/0232554 A1 | 11/2004 | Hirano et al. | |
| 2004/0245627 A1 | 12/2004 | Akram | |
| 2004/0251557 A1 | 12/2004 | Kee | |
| 2005/0124170 A1 | 6/2005 | Pelella et al. | |
| 2005/0230682 A1 | 10/2005 | Hara | |
| 2005/0236670 A1 | 10/2005 | Chien et al. | |
| 2006/0065935 A1 | 3/2006 | Vandentop et al. | |
| 2006/0183339 A1 | 8/2006 | Ravi et al. | |
| 2006/0189053 A1 | 8/2006 | Wang et al. | |
| 2006/0243655 A1 | 11/2006 | Striemer et al. | |
| 2007/0018247 A1 | 1/2007 | Brindle et al. | |
| 2007/0085131 A1 | 4/2007 | Matsuo et al. | |
| 2007/0181992 A1 | 8/2007 | Lake | |
| 2007/0254457 A1 | 11/2007 | Wilson et al. | |
| 2007/0262428 A1 | 11/2007 | Summers | |
| 2008/0013013 A1* | 1/2008 | Kim | G02B 6/0038 349/63 |
| 2008/0050863 A1 | 2/2008 | Henson et al. | |
| 2008/0081481 A1 | 4/2008 | Frohberg et al. | |
| 2008/0124889 A1 | 5/2008 | Roggenbauer et al. | |
| 2008/0128900 A1 | 6/2008 | Leow et al. | |
| 2008/0150100 A1 | 6/2008 | Hung et al. | |
| 2008/0165521 A1 | 7/2008 | Bernstein et al. | |
| 2008/0283995 A1 | 11/2008 | Bucki et al. | |
| 2008/0286918 A1 | 11/2008 | Shaviv | |
| 2008/0288720 A1 | 11/2008 | Atwal et al. | |
| 2008/0296708 A1 | 12/2008 | Wodnicki et al. | |
| 2008/0308946 A1* | 12/2008 | Pratt | H01L 21/563 257/777 |
| 2009/0011541 A1 | 1/2009 | Corisis et al. | |
| 2009/0026454 A1 | 1/2009 | Kurokawa et al. | |
| 2009/0026524 A1 | 1/2009 | Kreupl et al. | |
| 2009/0073661 A1 | 3/2009 | Wolfe et al. | |
| 2009/0160013 A1 | 6/2009 | Abou-Khalil et al. | |
| 2010/0140782 A1 | 6/2010 | Kim et al. | |
| 2010/0244934 A1 | 9/2010 | Botula et al. | |
| 2010/0314711 A1 | 12/2010 | Farooq et al. | |
| 2011/0140257 A1 | 6/2011 | Sweeney et al. | |
| 2011/0266659 A1 | 11/2011 | Wilson et al. | |
| 2012/0161310 A1* | 6/2012 | Brindle | H01L 21/84 257/734 |
| 2012/0205725 A1 | 8/2012 | Nygaard et al. | |
| 2013/0043595 A1 | 2/2013 | Williams | |
| 2014/0035129 A1 | 2/2014 | Stuber et al. | |
| 2014/0175637 A1 | 6/2014 | Stuber et al. | |
| 2015/0069511 A1 | 3/2015 | Nygaard et al. | |
| 2015/0108640 A1 | 4/2015 | Stuber et al. | |
| 2015/0249056 A1 | 9/2015 | Molin et al. | |

FOREIGN PATENT DOCUMENTS

| | | |
|---|---|---|
| EP | 0707388 A2 | 4/1996 |
| EP | 0986104 A1 | 3/2000 |
| GB | 2309825 A | 8/1997 |
| GB | 2418063 A | 3/2006 |
| JP | 2110974 | 4/1990 |
| JP | 03011666 | 1/1991 |
| JP | 04356967 | 12/1992 |
| JP | 07098460 | 4/1995 |
| JP | 9283766 | 10/1997 |
| JP | 2001230423 A | 8/2001 |
| JP | 2005175306 A | 6/2005 |
| JP | 2006186091 | 7/2006 |
| JP | 2008004577 A | 1/2008 |
| WO | 0225700 A2 | 3/2002 |
| WO | 2008011210 A1 | 1/2008 |
| WO | 2009045859 A1 | 4/2009 |

OTHER PUBLICATIONS

Examination report dated Nov. 29, 2013 for European Application No. 10734619.9.
International Search Report and Written Opinion dated Oct. 14, 2010 for PCT/US2010/042026.
International Search Report and Written Opinion dated Oct. 14, 2010 for PCT/US2010/042028.
International Search Report and Written Opinion dated Mar. 22, 2011 for International Application No. PCT/US2010/042027.
International Search Report and Written Opinion dated Mar. 31, 2014 for PCT Application No. PCT/US2013/073466.

(56) References Cited

OTHER PUBLICATIONS

Matloubian, M. "Smart Body Contact for SO1 MOSFETs", SOS/SOI Technology Conference, Oct. 3-5, 1989.
Notice of Allowance and Fees dated Aug. 19, 2014 for U.S. Appl. No. 13/725,245.
Notice of Allowance and Fees dated Jun. 18, 2014 for U.S. Appl. No. 13/746,288.
Notice of Allowance and Fees dated Nov. 27, 2012 for U.S. Appl. No. 13/459,110.
Office Action dated Apr. 23, 2014 for Chinese Patent Application No. 201080031814.1.
Office action dated Apr. 3, 2014 for U.S. Appl. No. 13/746,288.
Office Action dated Apr. 8, 2014 for Japanese Patent Application No. 2012-520758.
Office Action dated Aug. 29, 2014 for U.S. Appl. No. 12/836,510.
Office Action dated Aug. 31, 2012 for U.S. Appl. No. 12/836,559.
Office Action Dated Dec. 12, 2012 for U.S. Appl. No. 13/452,836.
Office action dated Dec. 2, 2013 for Chinese Patent Application No. 201080031818.X.
Office Action Dated Feb. 10, 2014 for U.S. Appl. No. 13/725,403.
Office Action dated Feb. 28, 2013 for U.S. Appl. No. 12/836,559.
Office Action dated Jul. 10, 2014 from Chinese Patent Application No. 201080031811.8.
Office Action dated Jul. 13, 2012 for U.S. Appl. No. 12/836,510.
Office Action dated Jul. 17, 2014 for U.S. Appl. No. 13/725,403.
Office Action dated Jul. 28, 2014 for Chinese Patent Application No. 201080031818.X.
Office Action dated Mar. 20, 2014 for U.S. Appl. No. 13/725,245.
Office Action dated Nov. 9, 2012 for U.S. Appl. No. 12/836,510.
Office Action dated Oct. 24, 2012 for U.S. Appl. No. 13/459,110.
Office action dated Oct. 30, 2014 for U.S. Appl. No. 13/725,403.
Office Action dated Oct. 4, 2013 for U.S. Appl. No. 13/746,288.
Office Action dated Oct. 7, 2014 for U.S. Appl. No. 12/836,559.
Sematech Manufacturing and Reliability Challenges for 3D ICs using TSVs, Sep. 25-26, 2008, San Diego, California "Thermal and Strees Analysis Modeling for 3D Memory over Processor Stacks", John McDonald, Rochester Polytechnic Institute.
Sleight, Jeffry W. et al., "DC and Transient Characterization of a Compact Schottky Body Contact Technology for SOI Transistors", IEEE Transactions on Electronic Devices, IEEE Service Center, Pisacataway, NJ, US, vol. 46, No. 7, Jul. 1, 1999.
Notice of Allowance and Fees dated Feb. 11, 2015 for U.S. Appl. No. 12/836,559.
Notice of Allowance and Fees dated Feb. 20, 2015 for U.S. Appl. No. 12/836,510.
Office action dated Feb. 4, 2015 for Chinese patent application No. 201080031818.X.
Office Action dated Jan. 20, 2015 for Japanese Patent Application No. 2012-520758.
Office Action dated Jan. 6, 2015 for Chinese patent application No. 201080031811.8.
Office Action dated Mar. 5, 2015 for U.S. Appl. No. 13/725,403.
Official Letter and Search Report dated Feb. 13, 2015 for Taiwanese patent application No. 99123128.
Official Letter and Search Report dated Mar. 6, 2015 for Taiwanese Patent Application No. 99123144.
Office Action dated Apr. 13, 2015 in U.S. Appl. No. 14/586,668.
Extended European Search Report dated Sep. 22, 2015 for European Patent Application No. 15171021.7.
Guarini et al., "Electrical integrity of state-of-the-art 0.13 µm SOI CMOS devices and circuits transferred for three-dimensional (3D) integrated circuit (IC) fabrication," in Electron Devices Meeting, 2002, Dec. 8-11, 2002, pp. 943-945.
Official letter and search report dated Sep. 9, 2015 for Taiwanese Patent Application No. 099123131.
Tan C.S., et al., "Wafer Level 3-D ICs Process Technology," Series on Integrated Circuits and Systems, 2008, Springer, chapters 4, 5, 6, 8, 9, 10, and 12 (entire).

\* cited by examiner

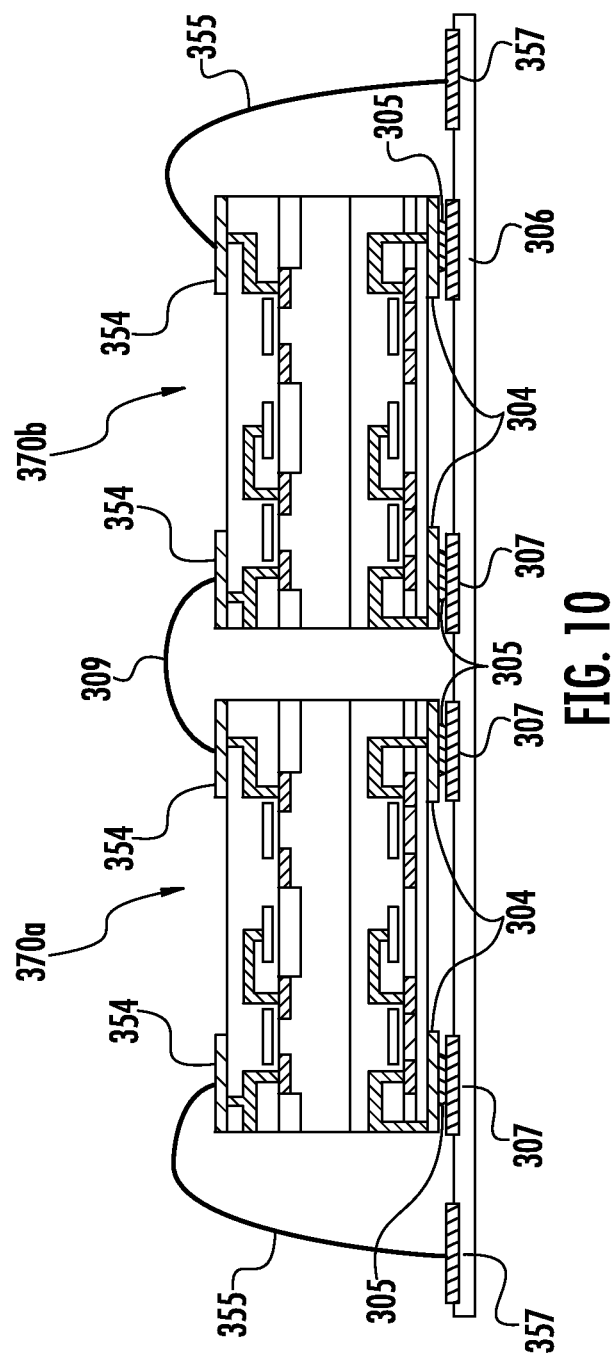

INTEGRATED CIRCUIT ASSEMBLY AND METHOD OF MAKING

CROSS-REFERENCE TO RELATED APPLICATIONS

This application is a continuation of U.S. patent application Ser. No. 13/725,306, filed Dec. 21, 2012, which is a continuation-in-part of U.S. patent application Ser. No. 13/459,110, filed Apr. 28, 2012, now U.S. Pat. No. 8,357,975, which, in turn, is a continuation of U.S. patent application Ser. No. 12/836,506 filed Jul. 14, 2010, now U.S. Pat. No. 8,232,597, which claims the benefit of U.S. Provisional Patent No. 61/225,914 filed Jul. 15, 2009. The content of U.S. Provisional Patent No. 61/225,914, U.S. Pat. No. 8,232,597, U.S. Pat. No. 8,357,975, and U.S. patent application Ser. No. 13/725,306 are incorporated herein by reference.

This application is related to Stuber et al., U.S. patent application Ser. No. 13/725,403 filed Dec. 21, 2012, "Back-to-back stacked integrated circuit assembly and method of making", and to Stuber et al., U.S. patent application Ser. No. 13/725,245, filed Dec. 21, 2012, "Thin integrated circuit chip-on-board assembly and method of making" both owned by the assignee of the present application, and hereby incorporated by reference.

FIELD OF THE INVENTION

The invention described relates to integrated circuit devices and processing generally, and more specifically to packaging and assembling integrated circuits into systems.

BACKGROUND OF THE INVENTION

Semiconductor-on-insulator (SOI) technology was first commercialized in the late 1990s. The defining characteristic of SOI technology is that the semiconductor region in which circuitry is formed is isolated from bulk substrate by an electrically insulating layer. This insulating layer is typically silicon-dioxide. The reason silicon-dioxide is chosen is that it can be formed on a wafer of silicon by oxidizing the wafer and is therefore amenable to efficient manufacturing. The advantageous aspects of SOI technology stem directly from the ability of the insulator layer to electronically isolate the active layer from bulk substrate. As used herein and in the appended claims, the region in which signal-processing circuitry is formed on an SOI structure is referred to as the active layer of the SOI structure. The term "active layer" is also used herein, and in the appended claims, to refer to any region of circuitry formed on any substrate. For example, an active layer may contain both active and passive devices. Moreover, the circuitry referred to by the term "active layer" need not contain any active devices; rather, such a layer may contain only passive devices. Examples of such passive circuits include bandpass filters and resistor dividers.

SOI technology represents an improvement over traditional bulk substrate technology because the introduction of the insulating layer isolates the active devices in an SOI structure which improves their electrical characteristics. For example, the threshold voltage of a transistor is desirously uniform, and is set in large part by the characteristics of the semiconductor material underneath the transistor's gate. If this region of material is isolated, there is less of a chance that further processing will affect this region and alter the threshold voltage of the device. Additional electrical characteristic improvements stemming from the use of the SOI structure include fewer short channel effects, decreased capacitance for higher speed, and lower insertion loss if the device is acting as a switch. In addition, the insulating layer can act to shield the active devices from harmful radiation. This is particularly important for integrated circuits that are used in space given the prevalence of harmful ionizing radiation outside the earth's atmosphere.

SOI wafer 100 is shown in FIG. 1. The wafer includes substrate layer 101, insulator layer 102, and active layer 103. The substrate is typically a semiconductor material such as silicon. Insulator layer 102 is a dielectric which is often silicon-dioxide formed through the oxidation of substrate layer 101. Active layer 103 includes a combination of dopants, dielectrics, polysilicon, metal layers, passivation, and other layers that are present after circuitry 104 has been formed therein. Circuitry 104 may include metal wiring; passive devices such as resistors, capacitors, and inductors; and active devices such as transistors. As used herein and in the appended claims, the "top" of SOI wafer 100 references top surface 105 while the "bottom" of SOI wafer 100 references bottom surface 106. This orientation scheme persists regardless of the relative orientation of SOI wafer 100 to other frames of reference, and the removal of layers from, or the addition of layers to SOI wafer 100. Therefore, active layer 103 is always "above" insulator layer 102. In addition, a vector originating in the center of active layer 103 and extending towards bottom surface 106 will always point in the direction of the "back side" of the SOI structure regardless of the relative orientation of SOI wafer 100 to other frames of references, and the removal of layers from, or the addition of layers to SOI wafer 100.

Semiconductor devices can be subject to a phenomenon known as the floating-body effect. Semiconductor-on-insulator devices are particularly susceptible to this effect. The manner in which the floating-body effect is exhibited by an n-type field effect transistor (NFET) will be described for illustrative purposes, but the floating-body effect is exhibited by many other active devices. FIG. 1B displays a side-view of NFET 108. NFET 108 is an SOI device, and is therefore disposed above insulator layer 102. The floating-body effect is caused by the presence of excess carriers in body 109. Carriers can build up in body 109 through random generation of electron and hole pairs by thermal or optical means, through scattering of high speed electrons in channel 110, through leakage from source 111 or drain 112, through band-to-band tunneling, or through avalanche breakdown in channel 110. The presence of excess carriers is therefore inevitable in any semiconductor device. However, in an SOI device, body 109 is isolated and limited as compared to a device whose body is part of bulk substrate. Therefore, far fewer excess carriers are needed to alter the characteristics of the active device.

Two alterations to the characteristics of an active device caused by the floating-body effect that are exacerbated by an SOI structure are the kink effect, and the non-linear capacitance exhibited by an active device that is in an off state. The introduction of excess carriers to body 109 due to avalanche breakdown caused by a high potential applied across source 111 and drain 112 will have the effect of greatly increasing the current through channel 110. The effect is called the kink effect because the relatively flat portion on a curve of the channel current against the drain-source potential will have a kink upwards at the point where this effect takes hold. The relatively flat portion of the curve is located in a region where the current is—for some applications—desirously set predominately by the voltage at gate 113. This effect can therefore be problematic because certain analog circuit applications are dependent upon the current of an active device being independent of the drain-source potential when operating in this region.

In contrast to the kink effect, the non-linearity of a device's off-state capacitances is not caused by avalanche breakdown. Instead, carriers build up through other less aggressive means as described above. If the potential of body 109 shifts to a significant enough degree, the capacitance seen by a signal at drain 112 will change in a non-linear fashion. The change will be non-linear because the excess carriers will build up in body 109 over time making the capacitance time-variant. Also, the charge build up will make the capacitance of the junction between body 109 and drain 112 dependent upon the signal at drain 112 which is also a characteristic of a non-linear system. This effect can be problematic because certain circuit designs are dependent upon the retention of a highly linear characteristic for their processed signals. For example, if NFET 108 was being used as a switch in a radio-frequency (RF) application wherein it had to be in an off state while a signal was transmitted on a line connected to drain 112, the capacitance from drain 112 to body 109 would have to be linear in order to prevent the production of unwanted harmonic distortion and inter-modulation distortion in the signal.

A common solution to the floating-body effect in SOI devices includes the introduction of a connection from body 109 to source 111. This solution is a subset of the more general family of solutions involving the use of what is called a "body tie", or "body contact". A body contact provides a connection to body 109 which serves to remove excess carriers. The particular solution of connecting body 109 to source 111 is employed most commonly because it is so simple. Unwanted charge that builds up in body 109 will be able to escape from body 109 to source 111, and will therefore not cause the kink effect or lead to the production of a non-linear capacitance.

Another solution to the floating-body effect in SOI devices involves the use of a smart body tie. A smart body tie is a body tie that changes its state based on the state of the device for which it is providing a tie. An example of a smart body tie can be described with reference to FIG. 1C. FIG. 1C comprises an NFET 114. The source of NFET 114 is connected to ground 115. The drain of NFET 114 is connected to drain contact 116. The gate of NFET 114 is connected to gate contact 117, and the cathode of diode 118. The body of NFET 114 is connected to the anode of diode 118. A similar configuration could function by replacing NFET 114 with a PFET and reversing the polarity of diode 118. This structure is advantageous in certain situations because the body tie formed by diode 118 will conduct much more when the device is off as compared to when the device is on. This can be very helpful for the situation described above wherein a non-linear off-state capacitance of the FET would imbue a processed signal on drain contact 116 with distortion. When gate contact 117 is low and the device is off, current will flow from the body of NFET 114 to gate contact 117 through diode 118. However, when gate contact 117 is high, the path from the body to gate will effectively be cut off. This can be highly advantageous given that the kink effect provides a benefit from the perspective of providing higher current during the device's on-state current. Therefore, this structure allows for the drawbacks of the floating body effect in one application to be eliminated while preserving the advantages of the floating body effect.

Although these approaches have advantageous aspects in that they are able to remove excess charge from the body of an active device, they are at the same time slightly problematic because they generally require another layer of processing in close contact to the active devices. This additional processing can complicate the fabrication process and can generally lead to non-idealities in the fabricated active devices through manufacturing errors. In addition, these approaches require additional area on the active wafer which increases the cost of the overall design. These approaches also suffer from the disadvantage of high resistance along the width of the transistor from the body tie to the most remote portion of the channel. High resistance can reduce the efficacy of the body tie in reducing floating body effects. Finally, these approaches may introduce parasitic capacitance to nodes of the device that will limit the speed of any circuit utilizing such a device.

Additionally, because of their unique structure, semiconductor-on-insulator integrated circuit chips offer opportunities to fit more electronic functions into smaller packages. Integrated circuit chips are typically attached to printed circuit boards. These boards contain one or more layers of metal traces and vias, providing electrical connections to chips and other components, thus completing the electronic system. By using innovative ways of attaching their component chips, boards can be made smaller in order to fit into smaller devices.

Integrated circuit chips can be attached to printed circuit boards in several ways. Often they are mounted in packages that have various configurations of pins, which, in turn, are inserted into holes in the printed circuit boards and fixed in place. For a smaller outline, the packaging step can be omitted, and the chip can be mounted directly on the board. A common chip mounting technique—for mounting chips both in packages and directly on boards—is wire bonding. In this method, thin wires connect pads in the package, or on the board, to pads on the chip. Usually, these bonding pads lie along the outside edges of the upper surface of the chip.

Since the board area needed for a wire-bonded chip exceeds the chip area by the length of the wires, other methods are available to replace wire bonding. In a second method, known as flip-chip or C4 (for controlled collapse chip connection), bond pads on the chip are coated with solder bumps, and the chip is mounted face down on the board. In this method, the footprint on the board used by the chip is no larger than the area of the chip. Eliminating the long wires may have performance advantages as well.

Another method of reducing board size is to stack chips on top of each other, while still being electrically connected to the board. Designers often find it advantageous to stack related chips—for example, a memory chip and its controller. In this case, the upper chip is usually connected directly to lower chip, and not necessarily to the board. Such a stacked chip assembly will typically require a vertical connection, such as a through-silicon via, to route signals and/or power to at least one of the chips. Such vertical connections, though expensive, can result in substantial package size reductions, especially if this technique is combined with flip-chip mounting. In these assemblies, both chips are either upside down, with C4 bumps formed on the lower chip; or they are mounted face-to-face, with the C4 bumps formed directly on vertical connectors.

In some cases, chip stacking may be beneficial but vertical connections are not required. For example, multiple identical memory chips may be connected to one controller chip, so as to increase memory capacity. In this case, the memory chips could be stacked and bonded individually to the printed circuit board, connecting them to the nearby controller chip. In these cases, both chips are typically mounted right side up, and both are wire bonded to the board. However, some of the area savings afforded by chip stacking is lost due to the area consumed by the multitude of wire bonds.

Thus, there is an increasing need to produce small, complex circuit boards in a cost-efficient manner.

SUMMARY OF THE INVENTION

In one embodiment, an integrated circuit assembly includes an insulating layer having a having a first surface and a second surface. A first active layer contacts the first surface of the insulating layer. A metal bond pad is electrically connected to the first active layer and formed on the second surface of the insulating layer. A substrate having a first surface and a second surface, with a second active layer formed in the first surface, is provided such that the first active layer is coupled to the second surface of the substrate.

In another embodiment, a method of fabricating an integrated circuit assembly includes providing a semiconductor-on-insulator that includes an insulating layer with a first surface and a second surface. A first active layer contacts the first surface of the insulating layer. A handle layer contacts the second surface of the insulating layer. A substrate having a first surface and a second surface is provided. A second active layer is formed on the first surface of the substrate. The first active layer is coupled to the second surface of the substrate. The handle layer is removed, and a metal bond pad, electrically connected to the first active layer, is formed on the second surface of the insulating layer.

BRIEF DESCRIPTION OF THE DRAWINGS

FIG. 10 is a cross-sectional view of another embodiment of a back-to-back stacked integrated circuit.

DETAILED DESCRIPTION OF THE EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the spirit and scope thereof. For instance, features illustrated or described as part of one embodiment may be used with another embodiment to yield a still further embodiment. Thus, it is intended that the present subject matter covers such modifications and variations as are within the scope of the appended claims and their equivalents.

Embodiments of the present invention provide for the production of SOI devices that have space-saving efficient back side body contacts. Embodiments of the invention achieve this result through the utilization of back side processing, the removal of portions of the SOI buried insulator layer, and the deposition of an electrically conductive material which connects a body contact of an active device to a second contact located in the same active layer as the active device itself.

Embodiments of the present invention also provide for an integrated circuit assembly including a semiconductor-on-insulator (SOI) coupled to the back surface of a substrate having an active layer formed on its front surface. The active layer of the SOI faces the back surface of the substrate, and pads are formed on the exposed insulator so as to electrically contact the SOI's active layer. Embodiments of the present invention also include methods of fabricating such an integrated circuit assembly. These methods include providing an SOI with an insulator interposed between an active layer and a handle layer, coupling the active layer to the back of a substrate having a second active layer on its front, removing the handle layer from the SOI, and forming a metal bond pad electrically contacting the SOI's active layer on the exposed insulator surface.

Figure 1A:
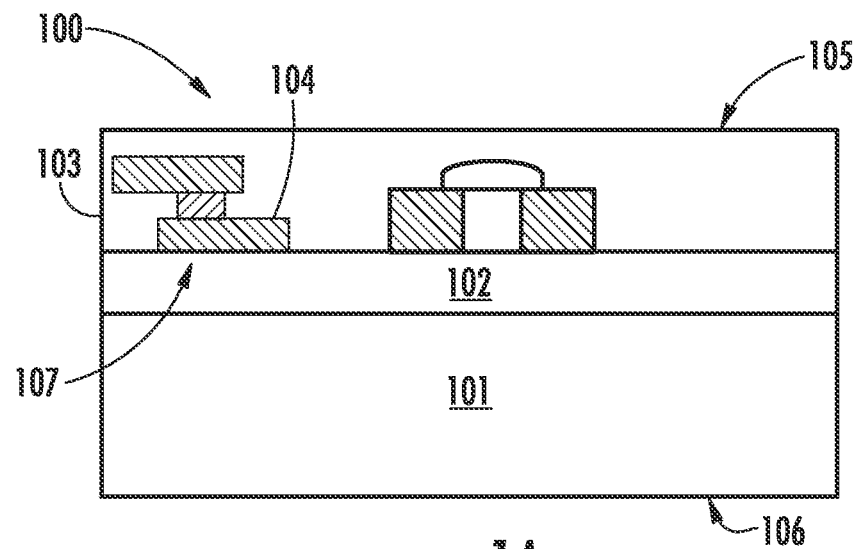
FIGS. 1A and 1B illustrate a block diagram of an SOI device that is susceptible to the floating-body effect that is in accordance with the prior art.
Figure 1B:
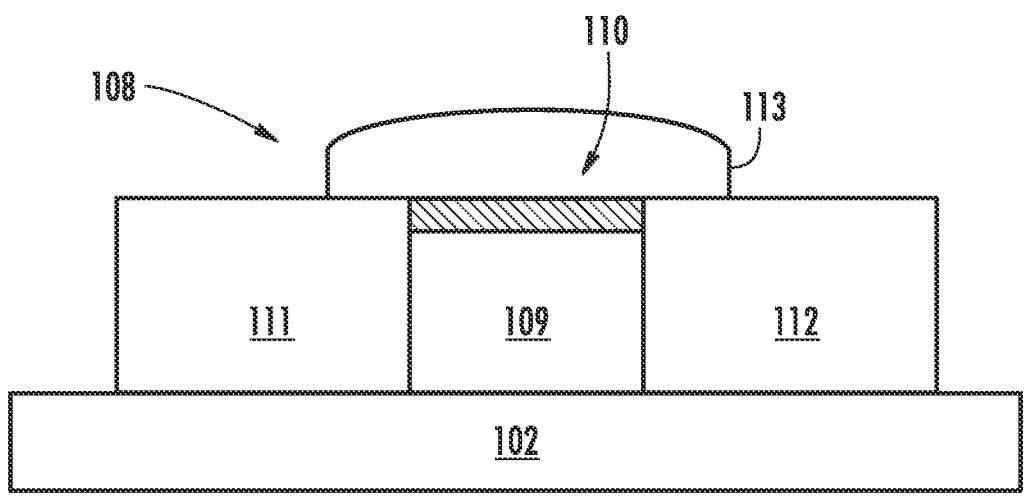
Figure 1C:
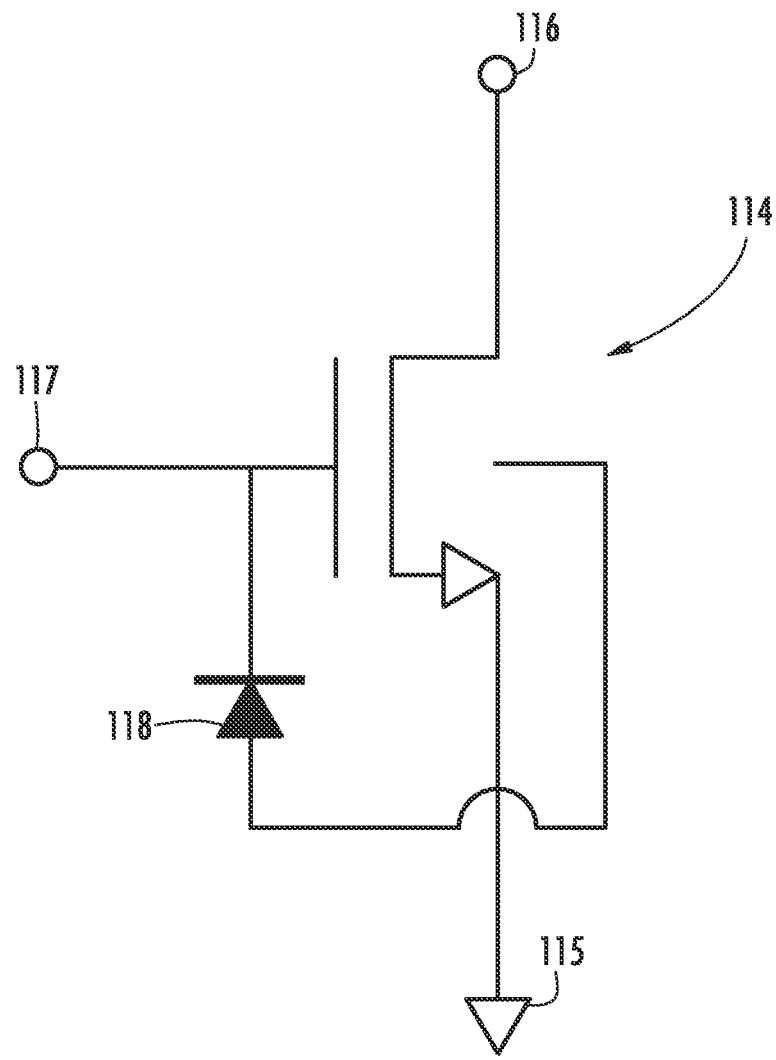
FIG. 1C illustrates a block diagram of an NFET with a smart body contact that is in accordance with the prior art.
Figure 2:
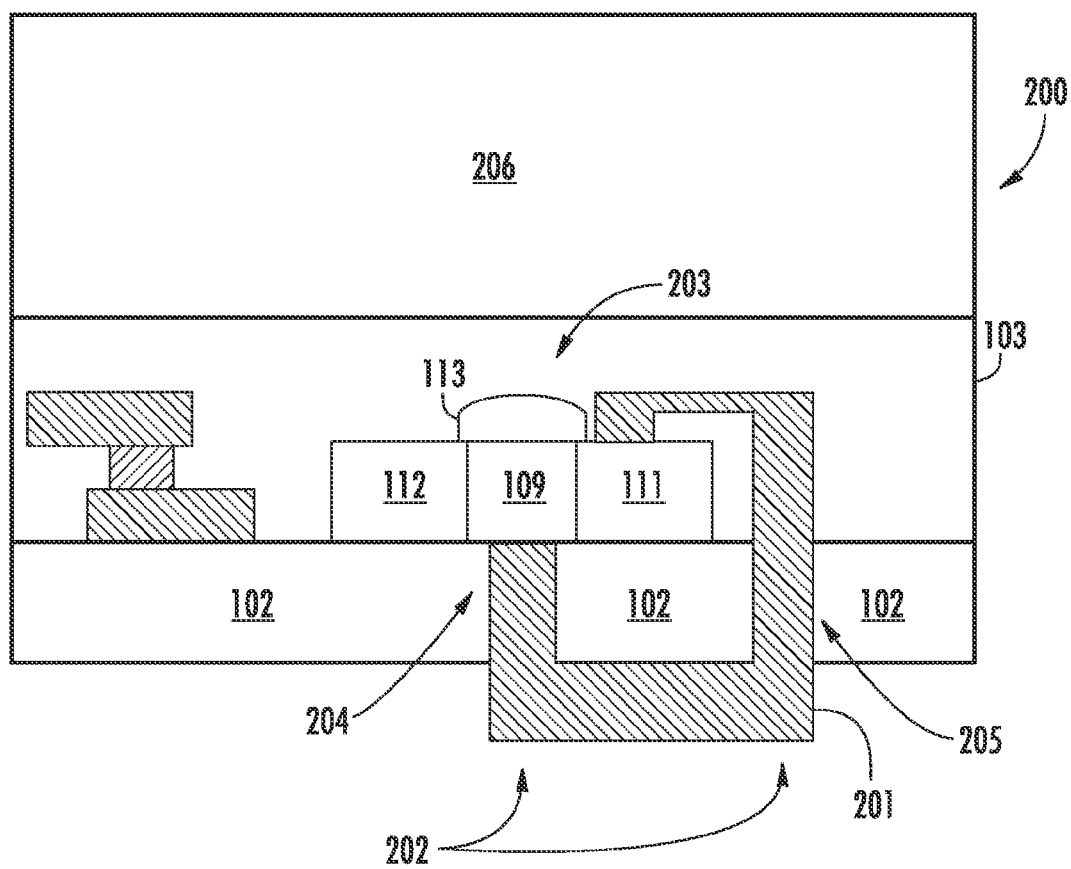
FIG. 2 illustrates a block diagram of an SOI structure with a back side body contact that is in accordance with the present invention.

FIG. 2 displays SOI structure 200 which is in accordance with the present invention. As with prior art SOI devices, active layer 103 is above insulator layer 102. Electrically conductive layer 201 is below insulator layer 102, and is disposed on the back side of insulator layer 102 such that it fills excavated insulator region 202. As seen in the figure, insulator layer 102 is at least partially vertically coextensive with electrically conductive layer 201 in excavated insulator region 202. As used herein and in the appended claims, the term "region" is not meant to be limited to the description of a single contiguous region. Excavated insulator region 202 therefore allows for separate physical contacts between the body 109 of active device 203 and electrically conductive layer 201 at body contact 204, and between said electrically conductive layer 201 and said active layer 103 at second contact 205. Active layer 103 is bonded to handle wafer 206 to provide support to active layer 103 while it is being processed. However, handle wafer 206 can be removed at a later time during processing. In addition, stability during processing may be provided by other means such that handle wafer 206 does not need to be attached at all.

Embodiments of the present invention which are described with reference to FIG. 2 in the previous paragraph function to remove excess carriers from body 109 to alleviate the floating body effect for active device 203. Excess carriers that build up in body 109 are able to flow out through electrically conductive layer 201 and back into active layer 103. Handle wafer 206 allows for the processing of the SOI structure from the back side which enables easy access to the body of active device 203. Advantageously, active device 203 can be formed in active layer 103 unimpeded by the need for body tie circuitry. As such, the body tie circuitry is much less likely to adversely affect the finished active devices or hinder the flexibility of a designer that develops the layout for the active devices. In addition, any parasitic capacitance that results from having body tie circuitry close by can be greatly alleviated because only a small contact is needed near the body of the device.

A specific embodiment of the present invention can be described with reference again to FIG. 2. In FIG. 2, a circuit branch comprising both body contact 204 and second contact 205 connects to both source 111 of active device 203, and body 109 of active device 203. In specific embodiments of the invention, the configuration shown in FIG. 2 allows excess carriers to flow to source 111 and then away from active device 203 along the source electrode. This is a convenient configuration given that the source of NFETs will generally be at a lower potential than body 109 so p-type carriers will flow out through this circuit branch. In addition, the source of a p-type field effect transistor (PFET) will generally be at a higher potential than body 109 so n-type carriers will flow out through this circuit branch. Another specific embodiment of the present invention comprises a circuit branch comprising both body contact 204 and second contact 205. However, in contrast to the configuration shown in FIG. 2, the circuit branch that includes body contact 204 and second contact 205 connects gate 113 to body 109. The resultant device is commonly referred to as a dynamic-threshold FET (DTFET or DTMOS). This configuration will function by providing a path for carriers to leave body 205 as they will be attracted to the signal source for gate 210. The DTMOS device provides higher threshold voltage when the transistor is biased in the OFF condition and lower threshold voltage when the device is in the ON condition. This advantageously provides low leakage when OFF and high drive strength when it is turned ON.

The back side processing concepts discussed above with reference to FIG. 2 can be applied to the formation of smart body contacts to form structures that are in accordance with the present invention. In specific embodiments of the present invention, a variable impedance circuit branch comprising body contact 204 and second contact 205 is configured to have a high impedance when active device 203 is in an on state, and a low impedance when active device 203 is not in an on state. Although these embodiments are described below with reference to NFET devices the same result can be achieved by using a PFET device in place of the described NFET device while also configuring any attached diodes to have opposite polarity.

Figure 3:
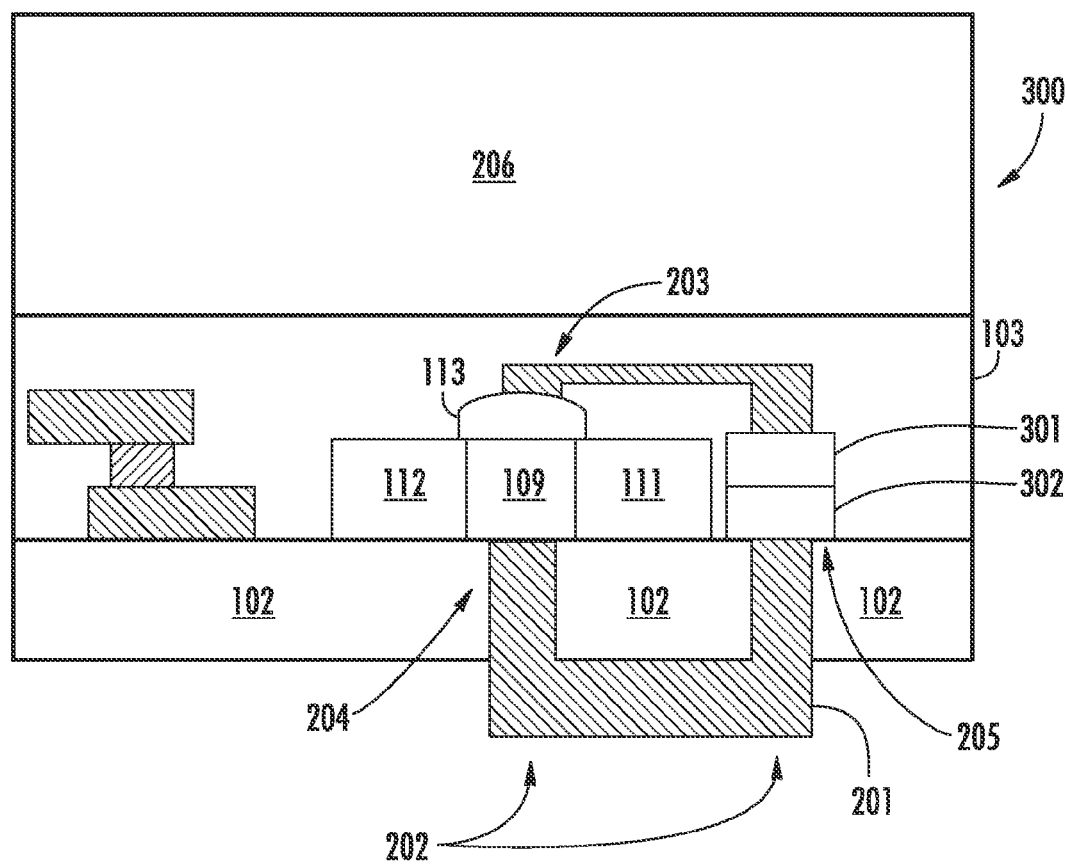
FIG. 3 illustrates a block diagram of an SOI structure with a back side body contact coupled to a gate through a pn-junction diode that is in accordance with the present invention.

An SOI structure 300 that is in accordance with the present invention can be described with reference to FIG. 3. In FIG. 3, gate 113 is coupled to electrically conductive layer 201 through a diode comprising anode 302 and cathode 301. In specific embodiments of the invention, anode 302 will comprise a region of active layer 103 that has been doped more using the same doping profile as body 109. In specific embodiments of the invention, such as embodiments employing thin-film silicon processes, anode 302 and cathode 301 will be side-by-side in active layer 103 rather than stacked vertically. The circuit branch comprising this diode has variable impedance based on the relative voltages of gate 113 and body 109. In the situation where the potential of gate 113 drops, the impedance of this variable impedance circuit branch will drop nearly to zero thereby latching body 109 to gate 113 when the gate is low.

Embodiments of the present invention which are described with reference to FIG. 3 in the previous paragraph function to filter the benefits of the floating-body effect from the effect's drawbacks when active device 203 is used in certain applications. These advantages are discussed above with reference to prior art smart body contacts. As before with reference to FIG. 2, these benefits are achieved without having to disturb or alter the layout of active device 203. Therefore, the design of active device 203 can be altered to accommodate other concerns decoupled from concerns regarding the floating-body effect. In addition, in specific embodiments of the invention the impedance of the variable impedance circuit branch in its low impedance state can actually be higher than in some prior art body contacts and still retain efficacy. In embodiments of the present invention utilizing smart body contacts to prevent harmonic distortion of a signal passing above an off state RF switch, the carriers that must be removed from the body are those generated through much slower processes than those generated by avalanche breakdown and impact ionization. The relevant processes are several orders of magnitude slower and therefore the generated charge can be removed even through a high impedance path. Therefore, the circuitry that comprises the variable impedance path lying within the active layer can be kept to a minimal size for a commensurately minimal impact on the overall size and cost of a device using SOI structure 300.

A specific embodiment of the present invention can be described with reference again to FIG. 3. In FIG. 3, body contact 204 is ohmic and there is negligible resistance from body contact 204 to second contact 205. Also, second contact 205 is directly below the diode comprised of cathode 301 and anode 302. Since active device 203 is an NFET the gate will go high during its on state. Therefore, anode 302 will be at a lower potential than cathode 301 and the diode will be reversed biased. This will prevent carriers from departing body 109 which will provide the NFET that is active device 203 to support a higher drive current and prevent forward bias of the body to source diode, which would cause high currents to flow in an undesired path. If active device 203 was a PFET the gate would go low during its on state. Therefore, anode 302 and cathode 301 would need to be switched in FIG. 3. If this configuration were applied, the diode would be reversed biased when the PFET was in its on state and the device 206 could support a higher drive current in its on state, and prevent forward bias of the body to source diode. Preventing forward bias of this diode is important to avoid the flow of high currents in an undesired path.

In specific embodiments of the present invention, the same bias scheme is provided to body 109 as described with reference to FIG. 3 using alternative structures. For example, an independent voltage bias source can be applied to body 109 through electrically conductive layer 201. This voltage bias source would provide a variable voltage depending upon the voltage on gate 113 to provide the same effect as described with reference to FIG. 3. As another example, a FET could be coupled in as part of variable impedance path to serve a similar function to that provided by the diode in FIG. 3, that is, the FET will provide a low impedance path from the body to the gate when the transistor is not in an on state, and will provide a high impedance path from the body to the gate when the transistor is in an on state. In specific embodiments of the invention, various other circuits and configurations are applied for removing the charge from body 109 in accordance with the concepts illustrated by FIG. 3.

Figure 4:
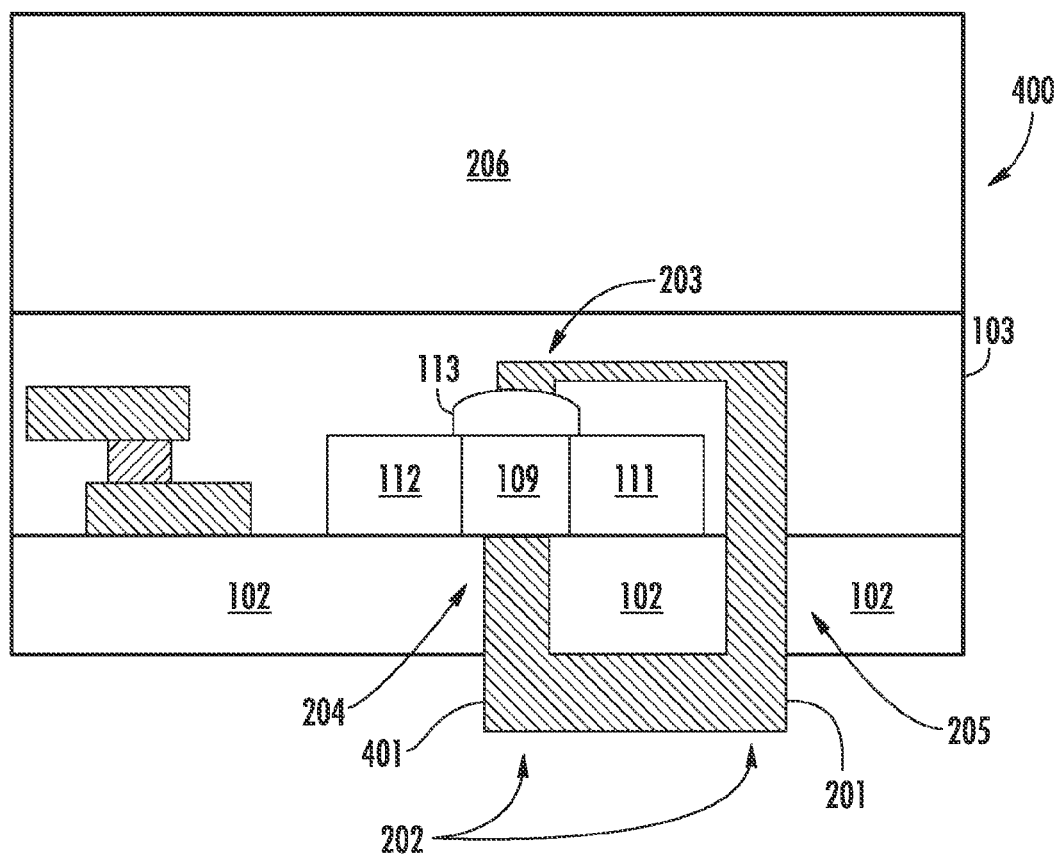
FIG. 4 illustrates a block diagram of an SOI structure with a back side body contact coupled to a gate through a hot-carrier-junction diode that is in accordance with the present invention.

An SOI structure 400 that is in accordance with the present invention can be described with reference to FIG. 4. FIG. 4 is similar to FIG. 2 with the exception that the circuit branch from second contact 205 rising up into active layer 103 is a variable impedance path 401. In specific embodiments of the invention, body contact 204 is a hot-carrier diode which provides for the variable aspect of variable impedance path 401. In specific embodiments where active device 203 is an NFET device, the hot-carrier diode would be reversed-biased when the potential on gate 113 was high, and forward biased if the potential on gate 113 was low. These embodiments will therefore exhibit the same characteristics described above with reference to smart body contacts. Advantageously, this configuration does not require any active devices to be built up in active layer 201. This will therefore save space given that variable impedance path 401 can be implemented using only a single metal line passing through active layer 103.

In specific embodiments of the invention, the metal used to form electrically conductive layer 201 is used for other purposes as well. For example, the metal may be used as assembly metal to provide contacts to the active layer. Such contacts could be used to provide power signals into the active layer. The contacts could also be used to route signal lines to and from the active layer. As another example, the metal can be run along the channel on the backside of the SOI structure to decrease the capacitance between body and source and between body and drain. The reason this configuration will reduce these parasitic capacitances is the metallization will not cross over the source or drain silicon and will instead remain over the channel or body area. Therefore the parallel plate capacitance between the body metal line and the source and/or drain is minimized. This will produce advantageous results given that the speed and performance of a device is inherently limited by the size of its parasitic capacitances.

Figure 5:
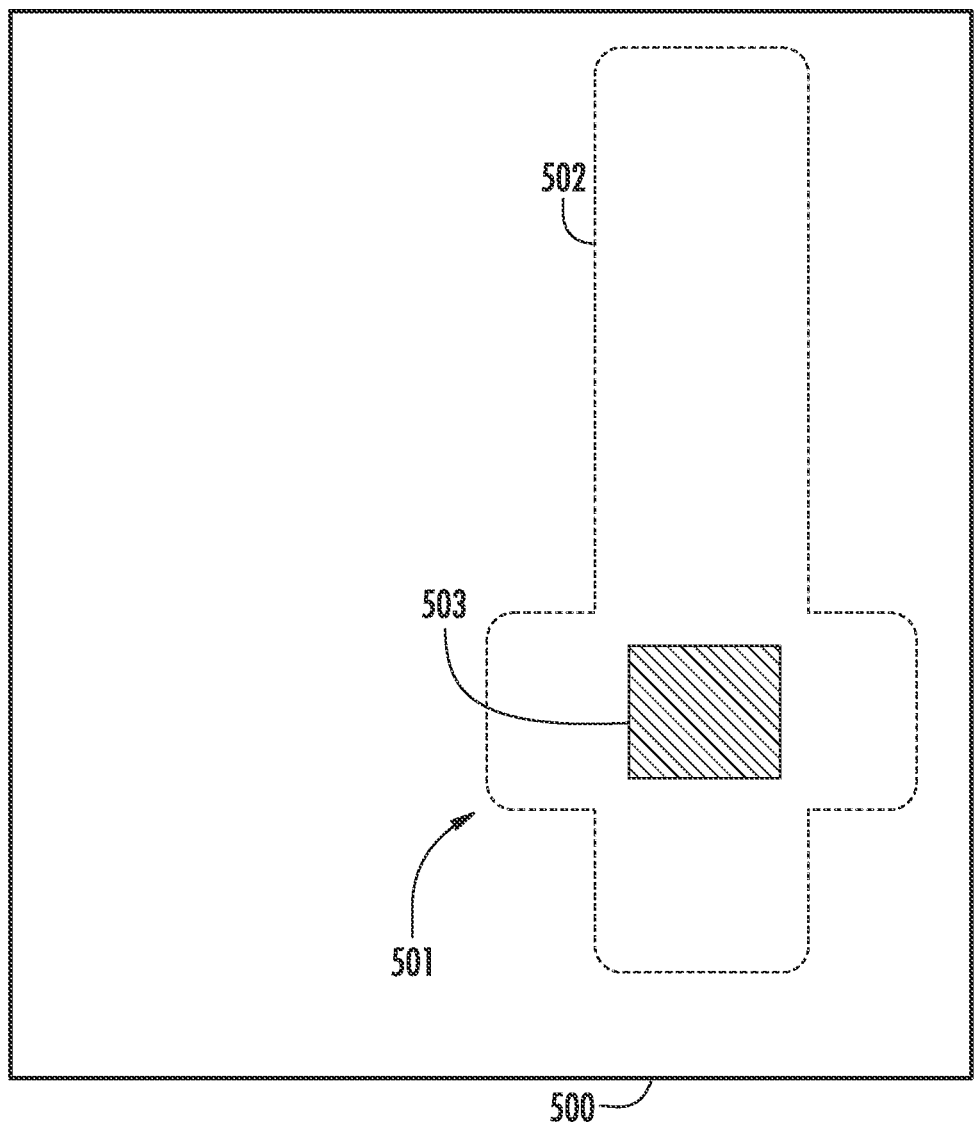
FIG. 5 illustrates a block diagram of the back side of an SOI structure having large polysilicon contact pads that is in accordance with the present invention.

A specific embodiment of the invention exhibiting large channel contacts can be described with reference to FIG. 5. FIG. 5 illustrates the back surface of SOI structure 500. Lithographic resolution and alignment capabilities of a fabrication process may preclude the creation of a contact to be used as body contact 204 with a high rate of success. A critical design failure would result if nearly any FET in a design was faced with a situation where its drain and source where shorted together by the electrically conductive material used for body contact 204. In specific embodiments of the invention, larger landing pads 501 of channel material can be made to increase the width of channel 502 at the channel contact locations by an amount sufficient to allow contact to the channel while ensuring that source or drain are not contacted. As seen in FIG. 5, the metal deposited to form backside contact 503 to form body contact 204 has a larger area to make contact with channel 502 at landing pad 501 thereby reducing constraints upon the manufacturing process and potentially increasing fabrication yield. One method that can be used to create a larger landing pad 501 includes widening the polysilicon gate in that shape. A second method that can be used to create a larger landing pad 501 includes altering the source and drain implant layout in that shape while keeping the polysilicon shape unchanged. Although these embodiments slightly work against the advantages of the present invention in terms of decoupling the body contact architecture from the transistor architecture, the modification would generally only need to be slight and would be minimal compared to prior art approaches that deposited body contacts directly under or adjoining the device itself in the active layer.

Methods of producing an integrated circuit that are in accordance with the present invention can be described with reference to FIG. 6. In step 600 an SOI structure undergoes processing to form an active device in an active layer of the SOI wafer. The circuitry formed during this step and in this layer can include but is not limited to technologies such as CMOS, BiCMOS, SiGe, GaAs, InGaAs, and GaN. The circuitry can comprise: various active devices such as diodes and transistors; various passive devices such as resistors, capacitors, and inductors; and routing circuitry such as metal wires and vias. Various photolithographic and chemical deposition steps can be conducted to formulate this circuitry. Step 600 includes the formation of a gate of the active device. Step 600 may also include the formation of contacts in the active layer that are disposed on the bottom of the active layer vertically adjacent to the insulator layer. These contacts may be made of channel material in the channel region of the active device. In specific embodiments of the invention, contacts may be made of areas of channel material that are wider than the remainder of a channel formed by the material. These larger areas could form landing pads for later connection to contacts deposited from the back of the active wafer as described above. Step 600 could also include the formation of contact separate from the active device, and a circuit branch that connects to a separate contact formed on the bottom of the active layer. This circuit branch could then connect to the source or gate of the active device. This circuit branch could be used to form part of a variable impedance path or general conductive path as described with regard to the devices described above. Finally, step 600 can also include the step of forming a diode in the active layer. This diode could then be used to form part of the variable impedance path described with regard to the devices described above. This diode can be placed directly above a contact but it can be placed anywhere in the active layer. The diode should be formed so as to match the necessary polarity for the devices described above to function properly in accordance with the present invention.

Figure 6:
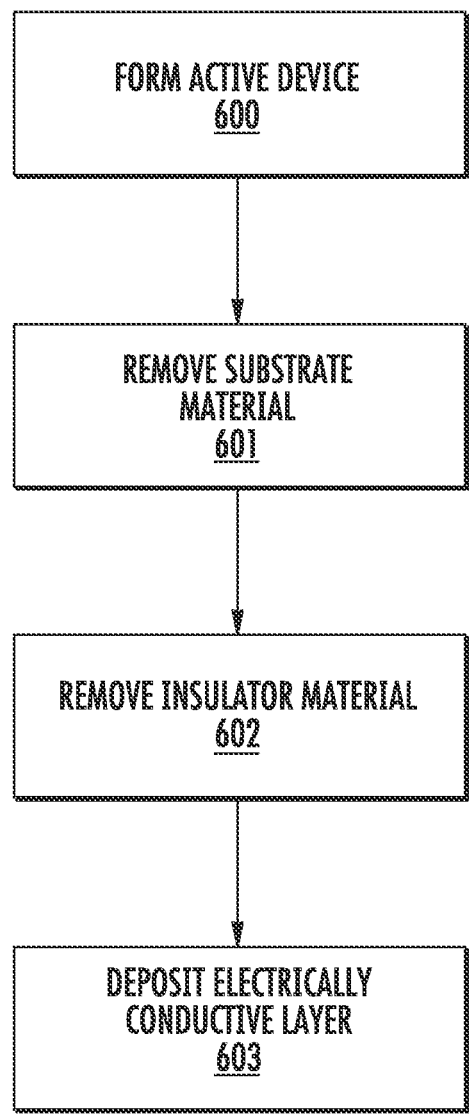
FIG. 6 illustrates a process flow chart of a method of fabricating an integrated circuit having a back side body contact that is in accordance with the present invention.

The remaining steps of the method illustrated by FIG. 6 involve backside processing. These steps may be preceded by the attachment of a temporary handle wafer to the top side of the SOI wafer. This wafer can provide stability to the SOI wafer while the remaining steps are carried out. However, as mentioned previously the attachment of this wafer is not necessary as support can be provided through other means. The handle wafer can have an insulator layer that bonds through various means to the top of the SOI wafer. However, the handle wafer may also have a layer that bonds to the top of the SOI wafer that is comprised of semiconductor material or a conductive material. In step 601, back side processing commences with the removal of the SOI wafer substrate. The substrate could be removed using mechanical and chemical means independently or in combination. For example, mechanical grinding can be used to thin the substrate material from an original thickness of approximately 800 micrometers (µm) to approximately 20 µm. If the substrate is silicon, the final thickness of substrate material may be removed with a wet etch such as KOH or TMAH. The final thickness of substrate material may also be removed using a dry plasma etch. The substrate can be removed with a high precision or etch rate ratio. The etch rate ratio refers to the ratio of the portion of desired substrate material that was removed from the back of the wafer to the portion of additional material that was removed which should not have been removed. In specific embodiments of the invention, the insulator layer is a buried-oxide that acts as an etch stop since the etch rate ratio is extremely high for the removal of all the substrate up to the buried oxide.

In specific embodiments of the invention, the removal of substrate material in step 601 is followed by the deposition of dielectrics or passivation layers. In specific embodiments of the invention, step 601 can be followed by the deposition of passivation layers to prevent ionic contamination of the SOI structure. Finally, in specific embodiments of the invention, step 601 can be followed by the deposition of dielectric layers which have the added benefit of reducing coupling capacitance between active devices in the active layer and the back side electrically conductive layer by spacing the electrically conductive layer away from the active devices.

In step 602, insulator material is removed from the back of the SOI wafer to form an excavated insulator region. In specific embodiments of the present invention, this excavated insulator region is located below a body of an active device in the active layer, and a second portion of this excavated insulator region is located below a separate portion of the active layer. In specific embodiments of the present invention, the excavated insulator region may be located underneath the prepared contacts that may have been produced in step 600. In specific embodiments of the invention, the separate portion of the active layer may be where a diode that was produced in step 600 is located. Step 602 may involve the removal of additional layers including passivation dielectric. In general, the pattern of insulator removal will allow for the deposition of an electrically conductive layer in step 603 that will allow electrical contact between any of the individual portions of the excavated insulator region. These patterns can be formed using standard photolithographic techniques and wet or dry etches.

In step 603, an electrically conductive layer is disposed on the back side of the SOI wafer. This layer can be applied in a patterned fashion to allow for connection between isolated sets of portions of the excavated insulator region. This electrically conductive layer will couple the body of an active device in one portion of the excavated insulator region to a separate portion of the excavated insulator region. The deposition of this electrically conductive material can be done using electron beam sputtering, electroplating, electroless plating, selective chemical vapor deposition, and various other methods. In specific embodiments of the invention, step 603 can be accompanied by the deposition of various other layers to provide improved thermal characteristics to the SOI structure. In specific embodiments of the invention, step 603 can be accompanied by the deposition of multiple layers in sequence providing barrier metal layers, anti-reflection coatings, and various other layers.

In specific embodiments of the invention, the electrically conductive material deposited in step 603 is patterned across the back of the SOI structure. The electrically conductive material can be patterned to run parallel or perpendicular with the channel of an active device in the active wafer. However, the electrically conductive material can be patterned independently of the channel orientations as well. In the specific embodiments where the electrically conductive material is patterned to run parallel with the channel, the overall capacitance seen by the active device will be decreased.

In specific embodiments of the invention, the electrically conductive material deposited in step 603 forms a hot-carrier diode junction between the active layer and the electrically conductive material at the body contact. In situations where the active device is a NFET and the body is thereby p-type, various materials can be used to create this device. A nonexclusive list of metals that can be used includes, aluminum, titanium, gold, palladium, nickel, platinum, and cobalt. If the device is a PFET and the body is thereby n-type, the same nonexclusive list includes, aluminum, platinum, chromium, gold, and hafnium. The benefits of the resulting configurations are described above. In order to reduce sheet resistance, a thin layer of the metal used to create the hot-carrier diode can first be deposited, followed by a layer of lower resistivity metal such as aluminum or copper.

In specific embodiments of the invention, the electrically conductive material deposited in step 603 is additionally used for assembly. The electrically conductive layer could comprise solder bumps, copper posts, or other types of packaging materials. This assembly metal could be used to provide power to the circuit in the active layer of the SOI structure, and could additionally route signals to and from the active layer of the SOI structure. This assembly material could also be disposed in a separate deposition after the electrically conductive layer used to generate the body contact has already been deposited.

An SOI structure 700 that is in accordance with the present invention can be described with reference to FIG. 7. SOI structure 700 comprises electrically conductive layer 201. Electrically conductive layer 201 comprises a single contiguous region of material. Electrically conductive layer 201 is at least partially vertically coextensive with insulator layer 102 in excavated insulator region 202. Electrically conductive layer 201 provides a low barrier contact to both body 109 and source 111. Therefore, body 109 is tied to source 111 with a single contact. A structure in accordance with these embodiments can be produced using methods described with reference to FIG. 6 with specific patterns applied for substrate removal in step 601 to expose the bottom of source 111.

Figure 7:
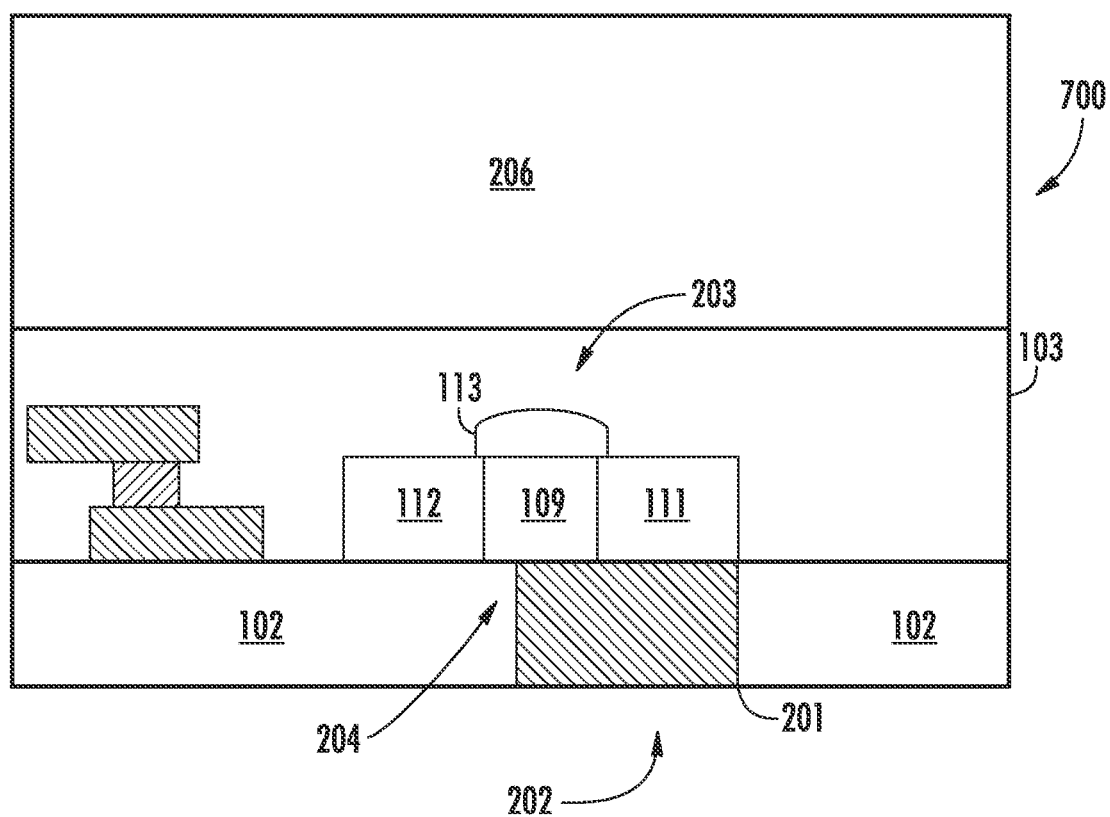
FIG. 7 illustrates a block diagram of an SOI structure that is in accordance with the present invention.

Specific embodiments of the invention that are in accordance with FIG. 7 exhibit advantageous characteristics. With reference to FIG. 5, these embodiments exhibit advantageous characteristics because the back side contact will naturally already have a larger landing pad to work with given that the single contact for electrically conductive layer 201 will be disposed on both body 109 and source 111. In addition, in specific embodiments the tie does not take up any room in active layer 103 because the tie exists solely within excavated insulator region 202. In specific applications, embodiments in accordance with FIG. 7 will be easier to manufacture than other embodiments discussed above.

Although embodiments of the invention have been discussed primarily with respect to specific embodiments thereof, other variations are possible. Various configurations of the described system may be used in place of, or in addition to, the configurations presented herein. For example, although the devices were discussed often with reference to silicon substrates and oxide insulator layers the invention will function with any form of semiconductor-on-insulator wafers, structures, or devices. For example, the invention will function in combination with silicon-on-sapphire structures. In addition, the invention can function or operate upon circuitry using any form of technology such as CMOS, bipolar, BiCMOS, SiGe, Ga, As, InGaAs, GaN and any other form of semiconductor technology or compound semiconductor technology. In addition, there may be additional layers of materials disposed between those layers mentioned herein. Semiconductor processing is a highly detailed field, and layers were only mentioned herein if they were absolutely necessary to describe the invention to avoid confusion. For example, there may be layers of passivation disposed on the active layer to prevent the circuitry from reacting with its environment. In addition, the use of the word "layer" such as when describing an active layer or a insulator layer does not preclude such layers being comprised of more than one material. For example, there may be layers of glass or some other insulator below metal lines in active circuitry in addition to a silicon-dioxide insulator beneath the entire active layer of an SOI structure. However, the term insulator layer can cover the entire structure of the glass and silicon-dioxide insulator.

Those skilled in the art will appreciate that the foregoing description is by way of example only, and is not intended to limit the invention. Nothing in the disclosure should indicate that the invention is limited to systems that require a particular form of semiconductor processing or to integrated circuits. Functions may be performed by hardware or software, as desired. In general, any diagrams presented are only intended to indicate one possible configuration, and many variations are possible. Although the disclosure was focused on the application of the invention to FET devices the invention will also help to alleviate parasitic issues for BJT devices in SOI architectures. Those skilled in the art will also appreciate that methods and systems consistent with the present invention are suitable for use in a wide range of applications encompassing any related to the accumulation of charge carriers in a specific region of an electronic device.

As another embodiment, the current invention discloses a stacked-chip assembly and a method of stacking chips. The chip-stacking procedure presented is simple and low-cost, can result in a thin and compact design, and is well suited to the integration of semiconductor-on-insulator integrated circuit chips. In embodiments of the present invention, methods are described in which the active and insulating layers of a semiconductor-on-insulator is transferred to the back surface of any mechanically stable structure having active circuits on its front surface. This mechanically stable structure, or substrate, may be, for example, a bulk semiconductor device wafer, or another semiconductor-on-insulator. The substrate thus provides support for the very thin active and insulating layers of the semiconductor-on-insulator. This transfer process does not require the extra steps of transferring to a temporary carrier first, then performing a second bond and removing the temporary carrier.

This results the transferred active layer being interposed between the substrate and the transferred insulating layer. Therefore, electrical access to the active layer can be made by excavating the insulating layer and forming a metal contact, as described in steps 602 and 603 of FIG. 6. This allows both layers of active circuitry to be accessed without the need for vertical connections between chips such as through-silicon vias. Vertical connections between chips often require expensive fine-accuracy alignment (<5 microns) of one chip to the other, since the vertical vias are often less than 5 microns in diameter, and spaced less than 5 microns apart. In the current invention, therefore, this expensive, highly accurate chip-to-chip alignment is not necessary.

In the current invention, either the semiconductor-on-insulator circuit or the circuit formed on the supporting substrate may be bonded to a printed circuit board with solder bumps (the "flip chip" method) for a minimal chip outline area. The supporting substrate may be thinned, enabling a very thin board assembly—often necessary for a small, thin electronic device.

Figure 8:
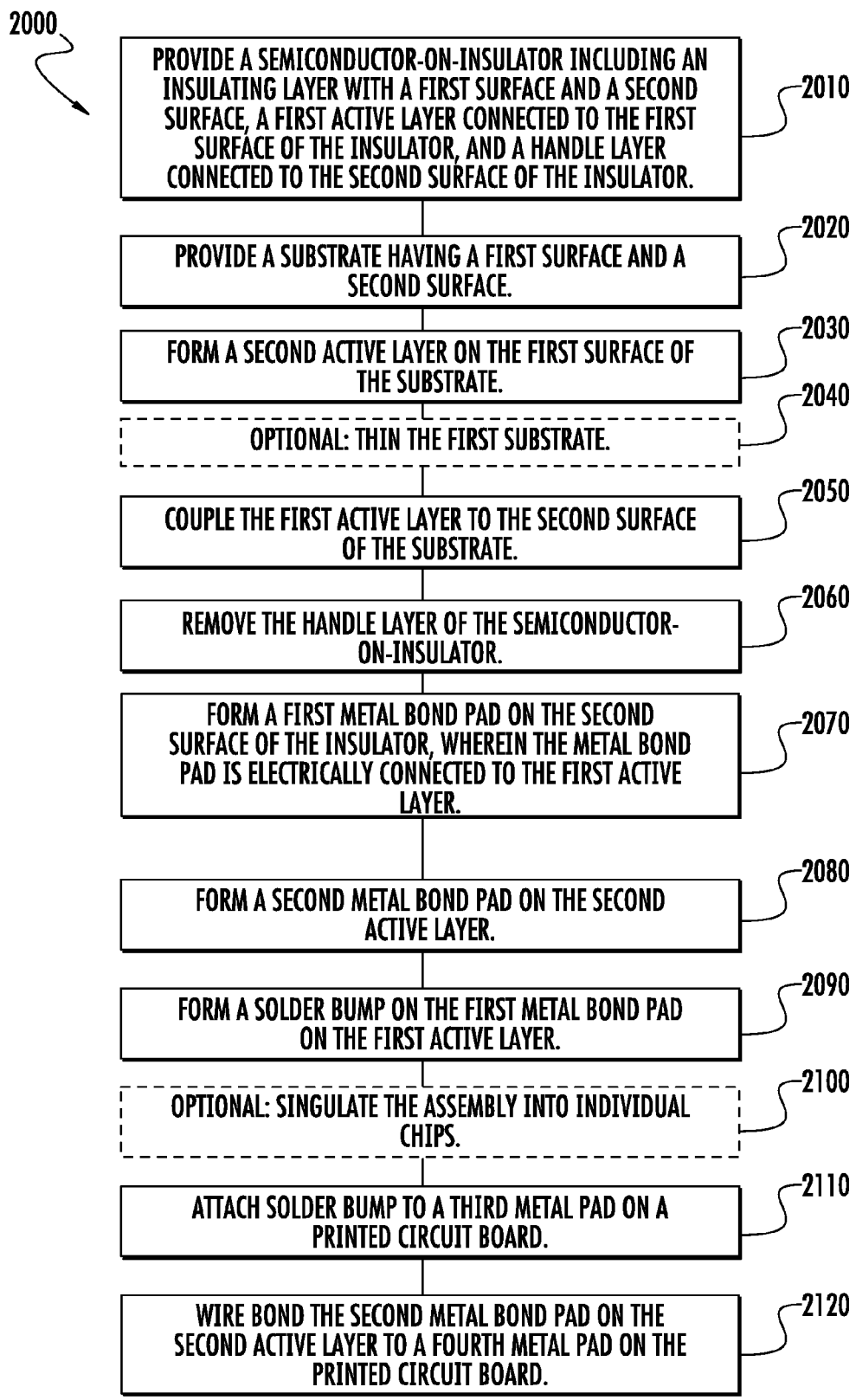
FIG. 8 is a flowchart of an exemplary method for forming a back-to-back stacked bulk integrated circuit.

FIG. 8 illustrates one embodiment of a method of the present disclosure, in which a semiconductor-on-insulator is transferred to the back of a substrate having a second integrated circuit on its front side. The resulting assembly is attached to a printed circuit board so as to electrically connect both circuits to the board. In flowchart 2000 of FIG. 8, a semiconductor-on-insulator including an insulating layer with a first surface and a second surface, a first active layer connected to the first surface of the insulator, and a handle layer connected to the second surface of the insulator, is provided in step 2010. The first active layer may be formed, for example, by using a standard complementary metal-oxide-semiconductor (CMOS) fabrication process, or other processes as described in step 600 of FIG. 6. Such a process may, for example, form transistors, contacts, and interconnect layers connected to form an integrated circuit.

In step 2020, a substrate with a first surface and a second surface is provided. In step 2030, a second active layer is formed in the first surface of the substrate. The second active layer may also be formed, for example, by using a standard CMOS process, which would include, for example, forming transistors, contacts, and interconnect layers. The substrate may comprise a semiconductor, such as, for example, silicon or germanium, or it may comprise an insulator, such as, for example, sapphire or quartz, or it may comprise any other type of material. In step 2040, the substrate may be thinned. Material may be removed from the second surface of the substrate by, for example, mechanical grinding. In step 2050, the first active layer is coupled to the second surface of the second substrate. Any suitable coupling or bonding method that results in a permanent bond may be used; for example direct or fusion bonding, permanent adhesive bonding, metallic interdiffusion or eutectic bonding. Note that, in some embodiments, this step would include an alignment step, such that scribe lines on the silicon on insulator and the substrate are roughly aligned to each other.

In step 2060, the handle layer of the semiconductor-on-insulator is removed, as described in step 601 in FIG. 6; that is, using mechanical and chemical means independently or in combination. In step 2070, a first metal bond pad is formed on the second surface of the insulator such that it is electrically connected to the first active layer. Techniques as described in steps 602 and 603 in FIG. 6 may be employed to form the first metal bond pad. These may include forming a via pattern on the insulator, using this pattern to etch via holes through the insulator to contact a layer of semiconductor or metal, and depositing and patterning a layer of metal into the via hole. This layer of metal may form, alone or in combination with subsequently deposited metal layers, the first bond pad. This pad may electrically connect to an input, output, power, ground, or some other node of the integrated circuit provided in step 2010.

Still referring to FIG. 8, a second metal bond pad is formed on second active layer in step 2080. As described in step 2070, this pad may electrically connect to an input, output, power, ground, or some other node of the integrated circuit formed in step 2030. Physically, this pad may connect to a metal interconnect layer formed as part of step 2030. In some embodiments, the formation of the second pad may take place before the bonding step 2050; for example, during the second active layer formation (step 2030). In step 2090, a solder bump is formed on the first metal bond pad on the first active layer. Prior to this bumping step, the chips on each active layer may be tested. In step 2100, the bonded assembly is optionally singluated into individual chips. This step may include, for example, dicing with a saw.

In step 2110 of FIG. 8, the solder bump is attached to a third metal pad on a printed circuit board. This step may be accomplished, for example, by completing the solder step; that is, by melting the solder bump so that it adheres to the material of the third metal pad on a printed circuit board. In step 2120, the second metal bond pad on the second active layer is wire bonded to a fourth metal pad on the printed circuit board. The resulting structure has two stacked integrated circuits, both of which are electrically connected independently to a printed circuit board.

Figure 9A:
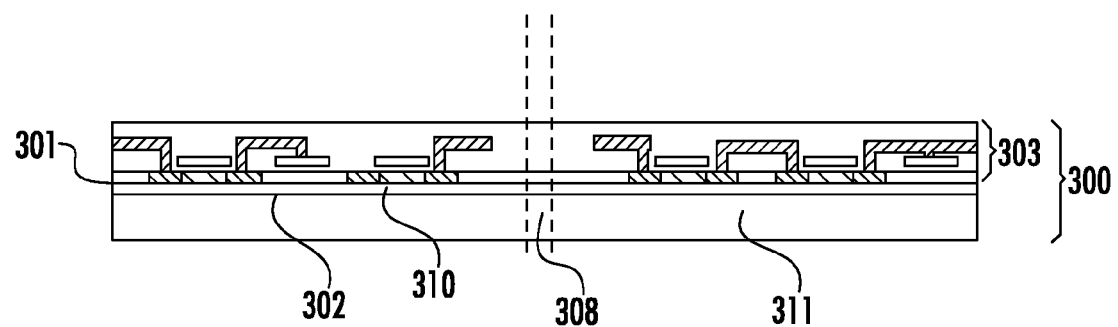
FIGS. 9a-9i illustrate cross-sectional views of stages of forming a back-to-back stacked integrated circuit according to some embodiments.

FIGS. 9a-9i illustrate an exemplary stacked integrated circuit fabricated according to the method of FIG. 8. In FIG. 9a, a semiconductor-on-insulator 300 is provided, comprising an active layer 303 and a handle layer 311, with an insulating layer 310 disposed between them. The insulating layer 310 has a surface 302 in contact with the handle layer 311. The handle layer 311 may be, for example, a silicon wafer which may be 500 to 900 microns thick. The insulator 310 may be, for example, silicon dioxide which may be 0.1 to 2 microns thick. The active layer 303 may be, for example, a thin silicon layer in which transistors (comprising, for example, gate, source, drain and body regions), isolation areas, contacts, and interconnect layers may have been formed. The thin silicon layer may be, for example, 0.05 to 3 microns thick. The active layer 303 may form a completed integrated circuit. This active layer could be formed with techniques similar to those described in step 600 of FIG. 6; that is, a CMOS or BiCMOS process, or a process that forms high-power devices or optoelectronic devices in addition to MOS transistors. Semiconducting materials used in this active layer formation may include, for example, Si, SiGe, GaAs, InGaAs, and GaN. This active layer may include, for example, semiconducting layers, isolation areas, contacts, insulating layers, and interconnect layers, forming a complete integrated circuit. The circuitry can comprise: various active devices such as diodes and transistors, various passive devices such as resistors, capacitors, and inductors. The active layer 303 may comprise a plurality of integrated circuits, separated by scribe lines 308. The width of these scribe lines may be, for example, 40 microns, or 80 microns.

Figure 9B:
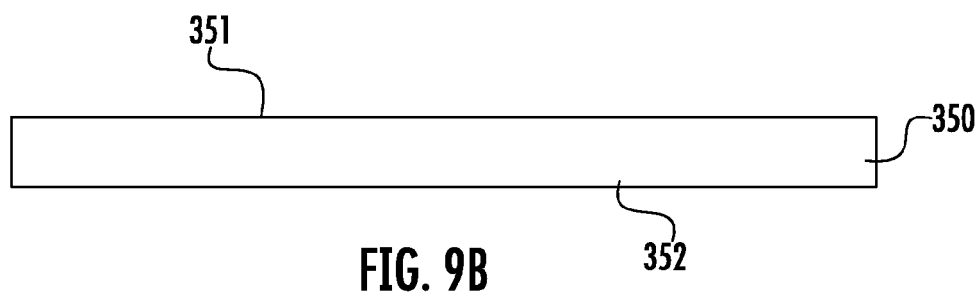
Figure 9C:
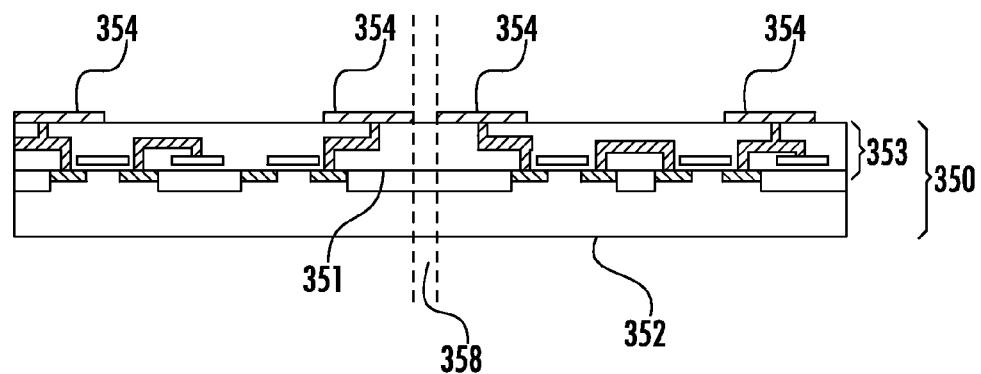

In FIG. 9b, a substrate 350, having a first surface 351 and a second surface 352, is provided. This substrate may be, for example, a silicon wafer which is, for example, 500 to 900 microns thick. Alternatively, this substrate may comprise a different semiconductor, for example, germanium, gallium arsenide, or gallium nitride, or it may comprise an insulator, for example, sapphire or quartz. In FIG. 9c, a second active layer 353 is formed on the first substrate 350. The second active layer 353 may be formed using any of the techniques described for use in the formation of the first active layer 303, for example, a CMOS process. The second active layer 353 may include any of the materials, structures, and circuit elements listed in the description of the first active layer 303; for example, silicon metal-oxide-semiconductor transistors, diodes, contacts, isolation areas, and interconnect. Similarly, the second active layer 353 may comprise a plurality of integrated circuits, separated by scribe lines 358. FIG. 9c also shows metal bond pads 354 formed in the second active layer. These metal pads may be made from any metal compatible with solder bumping or wire bonding; for example, copper or aluminum. The formation of the metal bond pads 354 in the second active layer 353 may also include the formation of a passivation layer, for example, silicon nitride or silicon oxynitride, to prevent the circuitry from reacting with its environment. Formation of the metal bond pads 354 would thus include forming pad openings to access the bond pads 354.

Figure 9D:
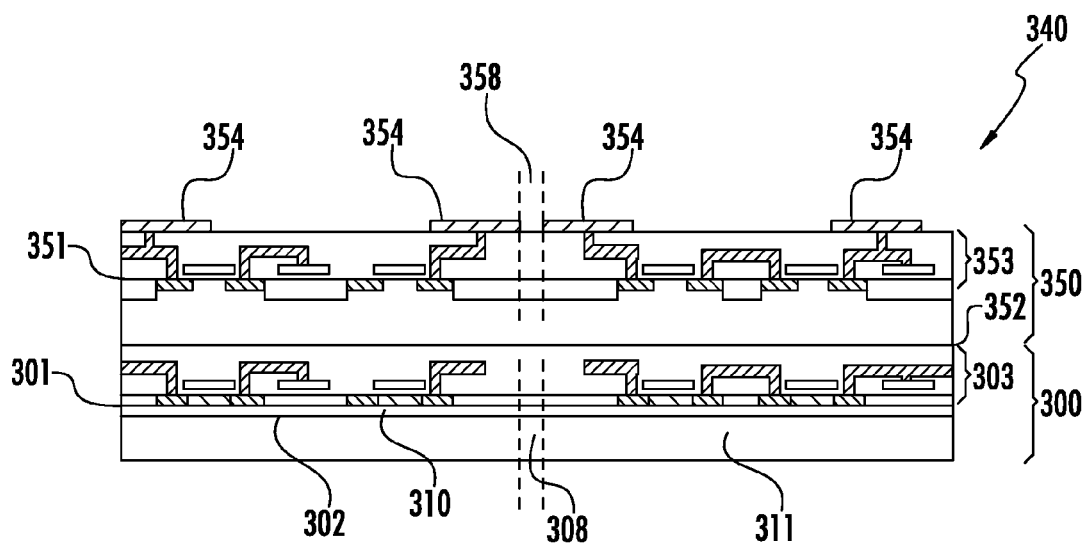

In FIG. 9d, the first active layer 303 is coupled to the second surface 352 of the substrate 350, forming the bonded integrated circuit assembly 340. Prior to this step, the substrate 350 may be thinned, for example, to a final thickness of 150 microns, or 100 microns, or 80 microns, or 50 microns, or 30 microns, or 10 microns. The thinning step may be include, for example, first attaching the substrate's first surface 351 to an adhesive background tape, or to a rigid handle wafer coated with adhesive. The substrate's second surface 352 then may undergo a mechanical or chemical-mechanical grinding step, or a purely chemical polishing step, or any combination of these. The adhesive background tape or rigid handle wafer is then removed.

Prior to coupling the active layer 303 to the second surface 352 of substrate 350, silicon-on-insulator 300 and substrate 350 may be aligned to each other, using, for example, infrared imaging. The purpose of this alignment may be to align the scribe lines 308 and 358 on top of each other. Thus, the accuracy required of this alignment step is dependent upon, for example, the width of the scribe lines 358 and 308; for example, the alignment accuracy may be one fourth of the scribe line width, or 10 microns, or 20 microns. This is a less stringent accuracy than what is needed for, for example, aligning wafers that must have through-silicon via connections completed by the bonding. Such alignments may require less than 1 micron of accuracy. Thus, embodiments of the present invention may use less expensive equipment and processes for bonding than what is required to form other integrated circuit assemblies.

The first active layer 303 and the second surface 352 of substrate 350 are then coupled together. This process may use, for example, a bonding process. Any of a number of methods for bonding may be used, including but not limited to: direct or fusion bonding, permanent adhesive bonding (using, for example, benzocyclobutene or polyimide), or bonding using metallic interdiffusion or eutectic layers, such as copper, tin, or gold. These bonding techniques may take place under atmosphere, or in a vacuum, at temperatures, for example, of less than 450 degrees Celsius (° C.), or less than 350° C., or less than 250° C., or at room temperature. Some bonding techniques, for example, metallic interdiffusion bonding, require relatively high bonding pressures (for example, 60 kilonewtons); others, for example, adhesive bonding or fusion bonding, require light bonding pressure (for example, less than 5 Newtons). Some bonding methods, such as direct or fusion bonding, may require a surface activation step, which may render each surface hydrophilic, allowing a van der Waals bond to form. Such an activation step may include a plasma treatment, a wet chemical treatment, or a combination of these. An annealing step at, for example, 400° C., may be required to convert the van der Waals bond to a covalent bond. Note that some bonding techniques, for example, adhesive or metallic interdiffusion bonding, require use of an intermediate layer (adhesive or metal, for example), which remains in the assembly (not shown in FIG. 9d).

Figure 9E:
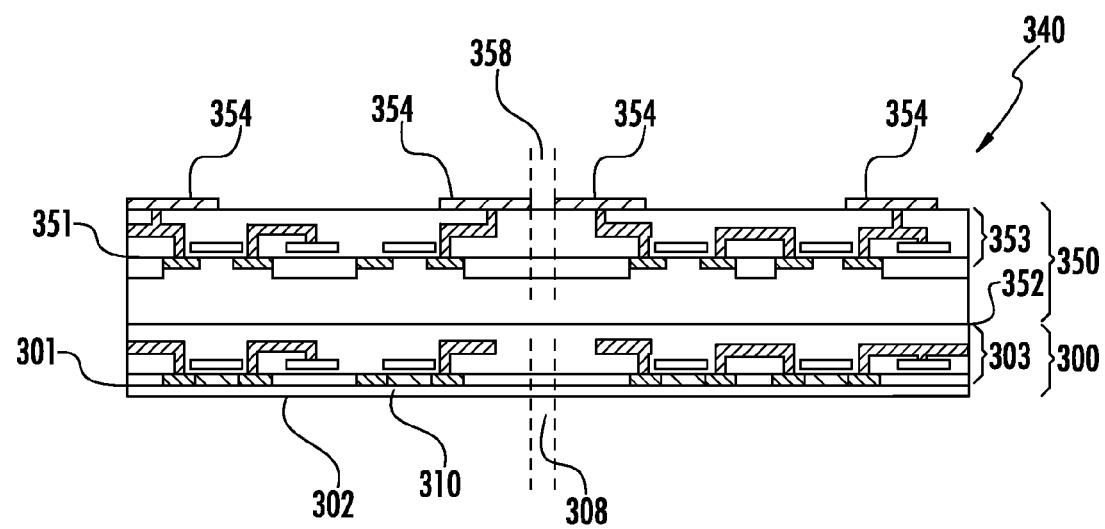

In FIG. 9e, the handle layer 311 is removed. This removal process may be similar to that described in detail in the discussion of step 601 in FIG. 6. For example, mechanical grinding can be used to thin the substrate material from an original thickness of approximately 800 microns (µm) to approximately 20 µm. If the substrate is silicon, the final thickness of substrate material may be removed with a wet etch such as potassium hydroxide (KOH) or tetramethylammonium hydroxide (TMAH). The final thickness of substrate material may also be removed using a dry plasma etch. The final step of this process may include an etch that has a high semiconductor-to-insulator selectivity. The selectivity refers to the ratio of the portion of desired substrate material that was removed from the back of the wafer to the portion of additional material that was removed which should not have been removed. For example, 20 weight % TMAH in water at 79.8° C. etches silicon dioxide only very slowly, and thus would provide a high selectivity etch. As described in the discussion of step 601 in FIG. 6, the removal of substrate material may be followed by the deposition of dielectrics or passivation layers to prevent ionic contamination of the SOI structure.

Figure 9F:
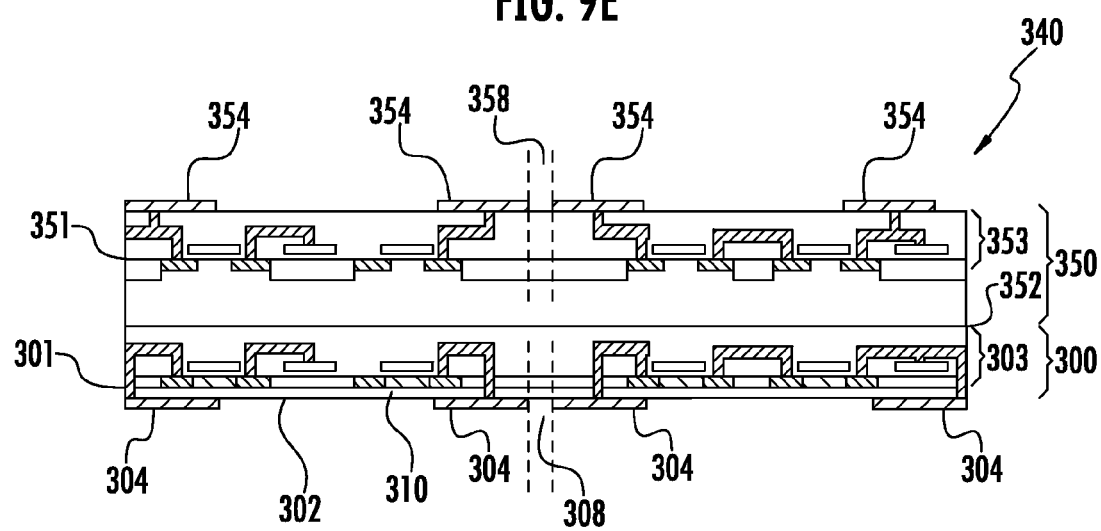

Turning to FIG. 9f, bond pads 304 are formed on the second surface 302 of insulating layer 310, electrically connecting to the first active layer 303. The method to form this pad may proceed as described in steps 602 and 603 of FIG. 6. In some embodiments, standard photolithographic techniques may be used to pattern and etch via holes in the insulating layer 310. These via holes may extend only through the insulating layer 310, or they may extend into any layers beyond the insulating layer. The via holes may terminate, for example, on a semiconductor or interconnect layer, or a filled contact that was previously formed during the formation of active layer 303. In some embodiments, deposited passivation layers would also be etched during the via hole formation process. Metal layers may then be deposited into the via holes, using standard techniques such as, for example, sputtering or electroplating. The metal layers may comprise, for example, aluminum or copper, or combinations of these. The metal layers may be patterned using standard positive or negative-tone photolithographic techniques. The bond pads 304 may be formed from these metal layers, or other metal layers subsequently deposited and patterned.

Figure 9G:
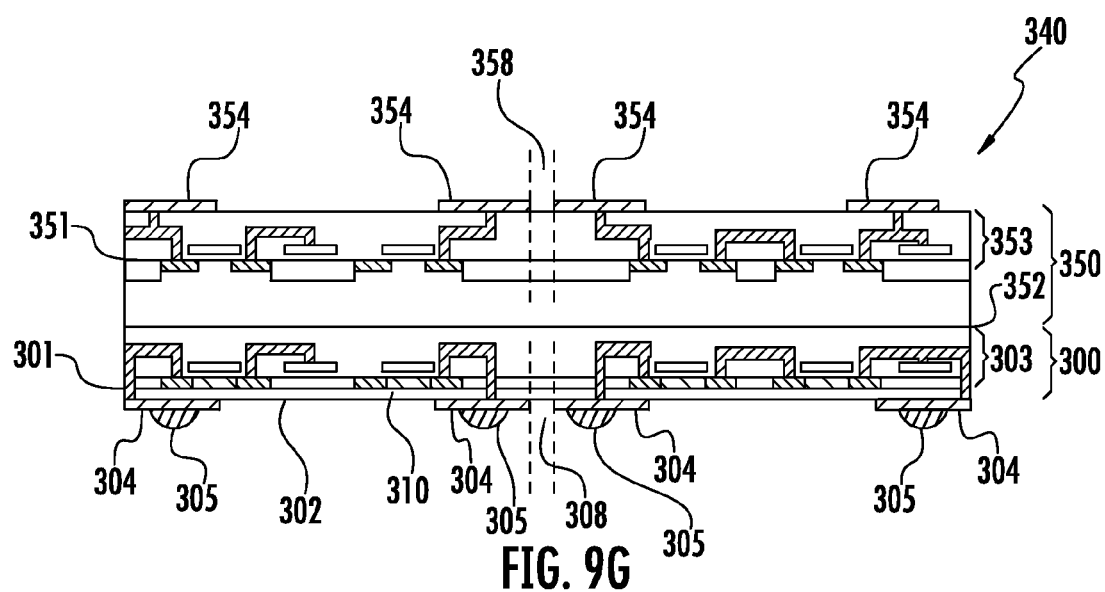

In FIG. 9g, solder bumps 305 are applied to the metal pads 304 connected to active layer 303. The solder bumps may be comprised of, for example, lead, tin, copper, bismuth, silver, gallium, indium, or some combination thereof. The solder bumps may be 500 microns in diameter, or 100 microns in diameter, or 50 microns in diameter, or 25 microns in diameter, and they may be placed on 1 mm pitches, or 200 micron pitches, or 100 micron pitches, or 50 micron pitches. The solder bumps may be applied by any of a number of processes; for example, by plating, screen printing, evaporation, or transfer from a glass mold. Prior to attaching solder bumps, the metal pads 304 may have additional metal layers, for example, titanium, tin, tungsten, copper, or some combination thereof, deposited on them. Also, the integrated circuits formed in active layers 303 and 353 may be electrically tested prior to attaching the solder bumps 305.

Figure 9H:
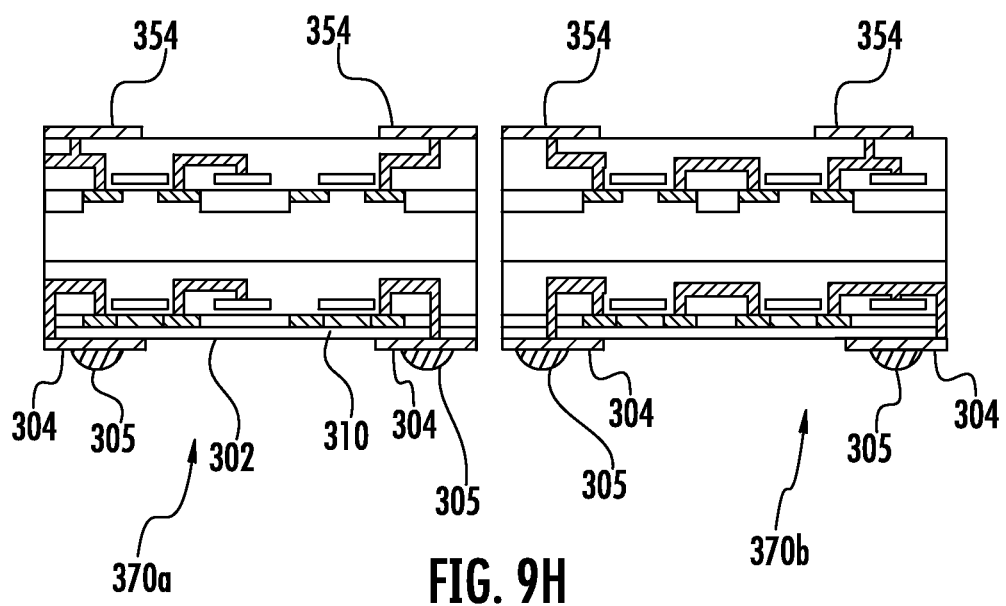

FIG. 9h shows two bonded integrated circuit assemblies 370a and 370b, formed by singulating the integrated circuit assembly 340 (FIG. 9g). This singulation process may use any of a number of methods to dice the bonded pair of wafers, for example, a mechanical saw, a laser cut, or a dry etch. The integrated circuit assemblies are separated along the scribe lines 308 and 358 (FIG. 9f).

Figure 9I:
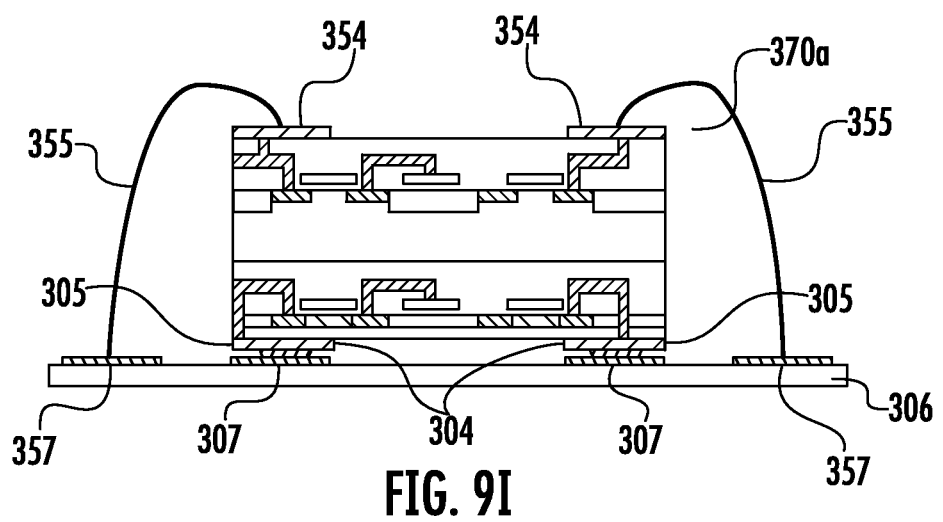

Turning to FIG. 9i, the bumped assembly 370a is attached to a printed circuit board 306, on which metal pads 307 and 357 have been formed. These pads may be comprised of, for example, copper or aluminum. Assembly 370a is placed such that the solder bumps 305 are contacting metal pads 307. The solder bumps are then melted to form an electrical connection between pads 307 on printed circuit board 306, and pads 304 on active layer 303. This melting can be performed by, for example, ultrasonic soldering or reflow soldering. The temperature required for this melting may be, for example, about 250° C., or about 200° C., or about 150° C. Underfilling of the bonded assembly 370a, wherein a dielectric layer (not shown) is inserted between the assembly 370a and the board 306, may also be performed.

Also shown in FIG. 9i is the connection of the metal pads 354 on the second active layer 353 to metal pads 357 on printed circuit board 306. This connection is made by use of wires 355. These wires may be comprised of, for example, aluminum, gold, or copper, which may be alloyed with, for example, beryllium or magnesium. To connect the wires 355 to the pads 307 and 354, any of a number of wire bonding processes may be used, including ball bonding or wedge bonding. The wires 355 are welded to pads 307 and 354 using heat, ultrasonic energy, pressure, or some combination thereof.

In FIG. 10, an alternative assembled structure is shown. In this structure, the first active layer 303 of integrated circuit assembly 370a may be electrically connected to active layer 303 of a second integrated circuit assembly 370b, instead of being connected to the printed circuit board 306. Such a connection may be established, for example, by wire bonding the pads 354 on assemblies 370a and 370b to each other using wire 309.

Figure 11A:
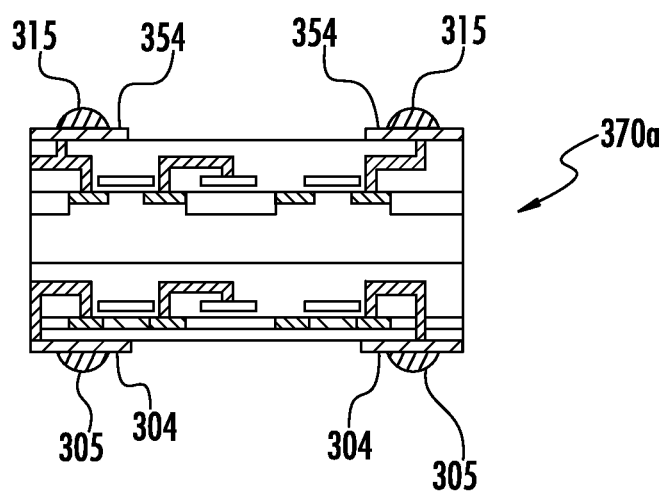
FIGS. 11a-11b are cross-sectional views of another embodiment of a back-to-back stacked integrated circuit.
Figure 11B:
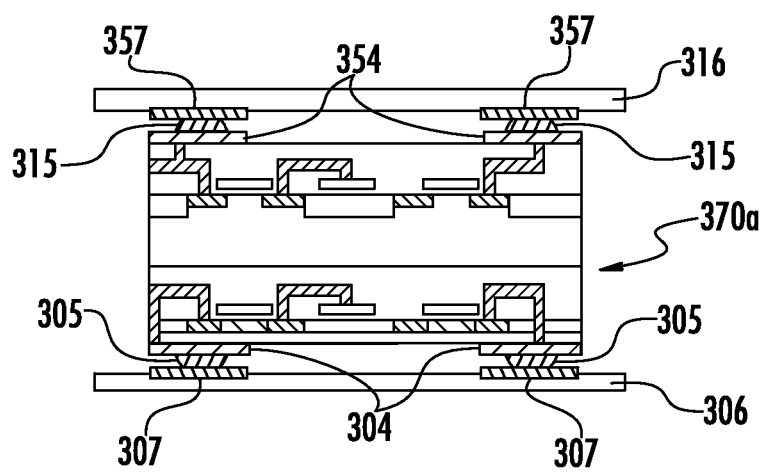

In FIGS. 11a-b, another alternative embodiment of an assembled structure is described. FIG. 11a shows a single integrated circuit assembly 370a with solder bumps 315 and 305 applied to the metal pads 354 and 304, respectively. In FIG. 4b, the bumped assembly 370a is attached to printed circuit boards 306 and 316, on which metal pads 307 and 357, respectively, have been formed. Assembly 370a is placed such that the solder bumps 305 are contacting metal pads 307, and the solder bumps 355 are contacting metal pads 357. The solder bumps are then melted to form electrical connections between pads 307 on printed circuit board 306 and pads 304 on active layer 303, as well as between pads 357 on printed circuit board 316 and pads 354 on active layer 353. This melting can be performed by, for example, ultrasonic soldering or reflow soldering.

Figure 12A:
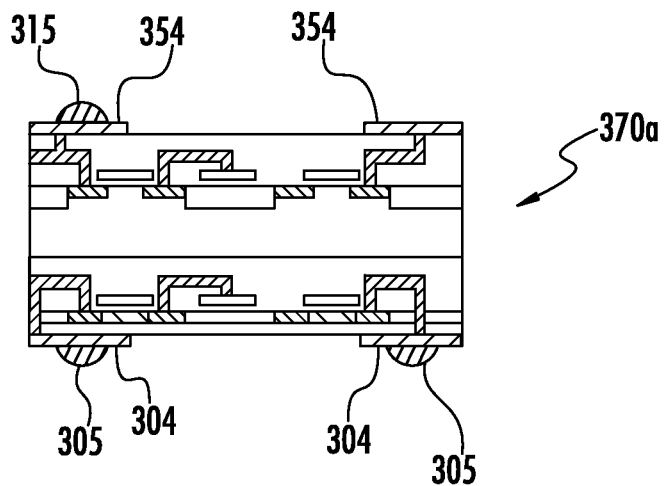
FIGS. 12a-12b are cross-sectional views of another embodiment of a back-to-back stacked integrated circuit, wherein a third integrated circuit is stacked on top of the back-to-back integrated circuit assembly.
Figure 12B:
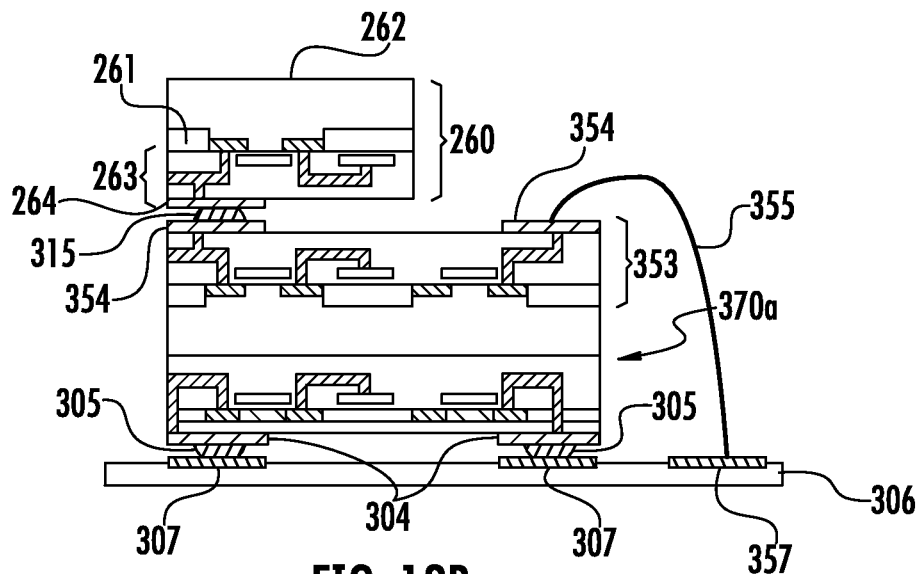

In FIGS. 12a-b, yet another alternative embodiment of an assembled structure according to the present invention is described. In this embodiment, three integrated circuits are stacked on top of each other and attached to a printed circuit board, in such a way as to provide all circuit elements in each of the three integrated circuits an electrical path to the printed circuit board. In FIG. 12a, solder bumps 315 are applied to some, but not all, of metal pads 354 of a single integrated circuit assembly 370a, in addition to the solder bumps 305 that are applied to pads 304. FIG. 12b shows a third substrate 260 having a first surface 261, a second surface 262, and an active layer 263 formed on the first surface 261. Pad 264 is formed in active layer 263. Third substrate 260 is placed such that pad 264 is contacting solder bump 315. FIG. 12b also shows a printed circuit board 306 having pads 307 and 357. Assembly 370a is placed such that the solder bumps 305 are contacting metal pads 307. The solder bumps are then melted to form electrical connections between pads 307 on printed circuit board 306 and pads 304 on active layer 303, as well as between pads 264 on substrate 260 and some of pads 354 on active layer 353. Finally, FIG. 12b also shows a wire 355 connecting other pads 354 to pads 357 on printed circuit board 306. In this way, circuit elements in the active layer 263 may have an electrical path to the printed circuit board 306 through circuit elements in active layer 353.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those skilled in the art, without departing from the spirit and scope of the present invention, which is more particularly set forth in the appended claims.

The invention claimed is:

1. A method comprising:
   providing a first wafer including:
      an insulating layer having a first surface and a second surface;
      a first active layer contacting the first surface of the insulating layer;
      a handle layer contacting the second surface of the insulating layer;
   providing a second wafer including:
      a substrate having a first surface and a second surface;
      a second active layer contacting the first surface of the substrate;
   bonding the second wafer to the first wafer by physically connecting the first active layer to the second surface of the substrate;
   removing the handle layer; and
   forming a metal bond pad on the second surface of the insulating layer;

wherein the metal bond pad is electrically connected to the first active layer.

2. The method of claim 1 further comprising forming a metal bond pad on the second active layer.

3. The method of claim 1 further comprising thinning the substrate before physically connecting the first active layer to the second surface of the substrate.

4. The method of claim 1, wherein the substrate is a semiconductor wafer.

5. The method of claim 1, wherein the first active layer comprises a complementary metal-oxide-semiconductor circuit.

6. The method of claim 1, wherein the first active layer or the second active layer includes passive devices.

7. The method of claim 1, further comprising:
 singulating the bonded first and second wafers into individual integrated circuit chips.

8. The method of claim 1, further comprising:
 electrically connecting a printed circuit board to the first active layer and the second active layer.

9. The method of claim 8, wherein the step of electrically connecting the printed circuit board to the first active layer and the second active layer comprises:
 forming a second metal bond pad on the second active layer;
 forming a solder bump on the first metal bond pad on the second surface of the insulating layer;
 attaching the solder bump to a third metal bond pad on the printed circuit board; and
 wire bonding the second metal bond pad on the second active layer to a fourth metal bond pad on the printed circuit board.

10. The method of claim 8, wherein the step of electrically connecting the printed circuit board to the first active layer and the second active layer comprises:
 forming a second metal bond pad on the second active layer;
 forming a solder bump on the second metal bond pad on the second active layer;
 attaching the solder bump to a third metal bond pad on the printed circuit board; and
 wire bonding the first metal bond pad on the second surface of the insulating layer to a fourth metal bond pad on the printed circuit board.

11. The method of claim 1, wherein the step of physically connecting the first active layer to the second surface of the substrate comprises fusion bonding of two surfaces.

12. The method of claim 1, wherein the step of physically connecting the first active layer to the second surface of the substrate comprises:
 applying an adhesive layer to the second surface of the substrate; and
 contacting the first active layer to the adhesive layer.

13. The method of claim 1, wherein the step of physically connecting the first active layer to the second surface of the substrate comprises aligning the substrate with the first active layer to an accuracy of no less than 5 microns.

14. The method of claim 1, wherein the first wafer is a semiconductor-on-insulator.

\* \* \* \* \*